(12) United States Patent
Pfirsch

(10) Patent No.: US 6,803,627 B2
(45) Date of Patent: Oct. 12, 2004

(54) REVERSE-BLOCKING POWER SEMICONDUCTOR COMPONENT HAVING A REGION SHORT-CIRCUITED TO A DRAIN-SIDE PART OF A BODY ZONE

(75) Inventor: Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/757,826

(22) Filed: Jan. 15, 2004

(65) Prior Publication Data

US 2004/0145013 A1 Jul. 29, 2004

Related U.S. Application Data

(62) Division of application No. 10/158,035, filed on May 30, 2002, now abandoned.

(30) Foreign Application Priority Data

May 30, 2001 (DE) .......................................... 101 26 309
May 30, 2001 (DE) .......................................... 101 26 308

(51) Int. Cl.[7] .......................... H01L 29/76; H01L 29/74; H01L 31/111; H01L 29/94; H01L 31/062
(52) U.S. Cl. .......................... 257/341; 257/129; 257/132; 257/139; 257/138; 257/140; 257/141; 257/342; 257/343
(58) Field of Search ................................. 257/678, 341, 257/342, 343, 122, 129, 132, 139, 141, 147, 162, 138, 140, 335, 168

(56) References Cited

U.S. PATENT DOCUMENTS

| | | | |
|---|---|---|---|
| 4,754,310 A | 6/1988 | Coe | |
| 5,202,750 A | 4/1993 | Gough | |
| 5,319,221 A | 6/1994 | Ueno | |
| 5,489,787 A | 2/1996 | Amaratunga et al. | |
| 5,625,203 A | 4/1997 | Lilja | |

*Primary Examiner*—Steven Loke
(74) *Attorney, Agent, or Firm*—Laurence A. Greenberg; Werner H. Stemer; Ralph E. Locher

(57) ABSTRACT

A reverse-blocking power semiconductor component includes a drift path subdivided into a source-side area and a drain-side area by a region with opposite doping. Provided above this region is a gate. Alternatively, the body zone of the one conduction type is subdivided into a source-side part and a drain-side part by a region of the other conduction type. This region acts as an electron collector. The reverse-blocking power semiconductor component can be incorporated in compensation components, and power transistors. Methods for producing power semiconductor components are also provided.

18 Claims, 19 Drawing Sheets

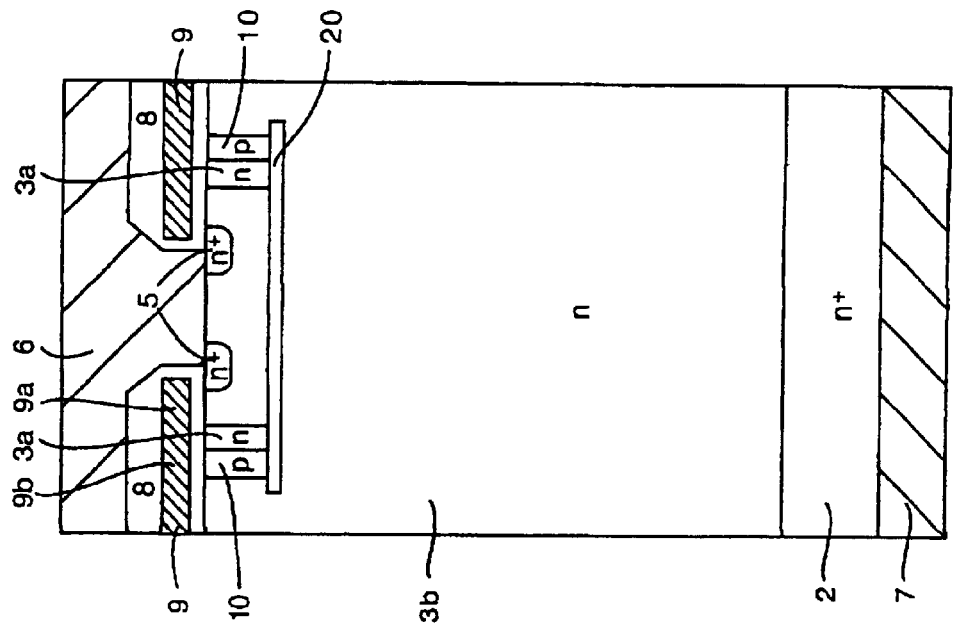
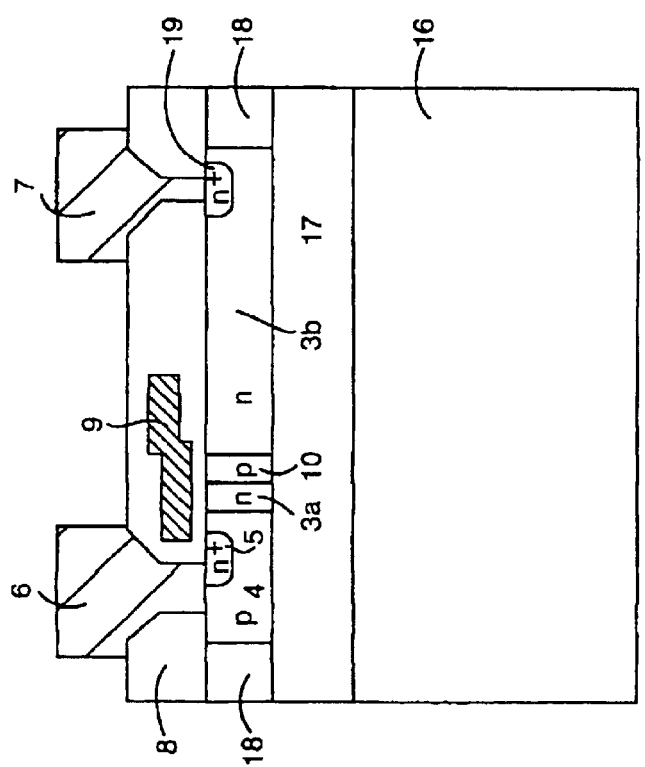

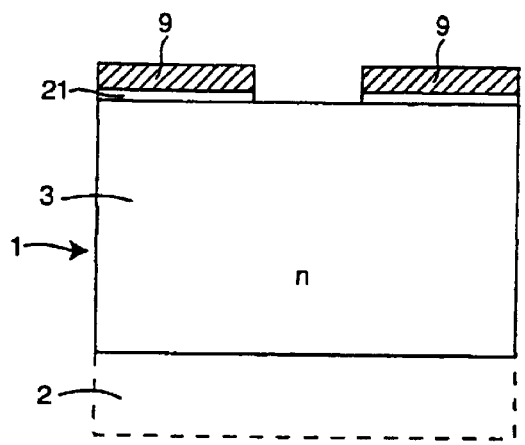
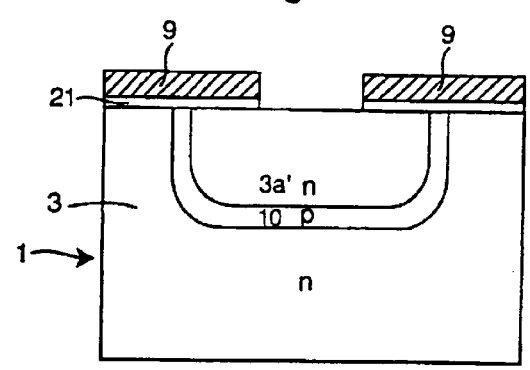
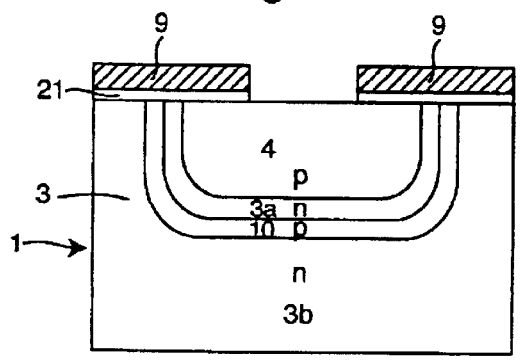
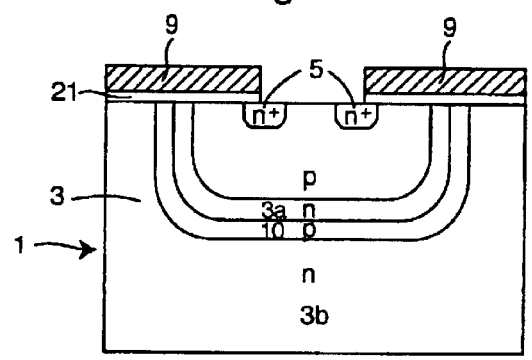
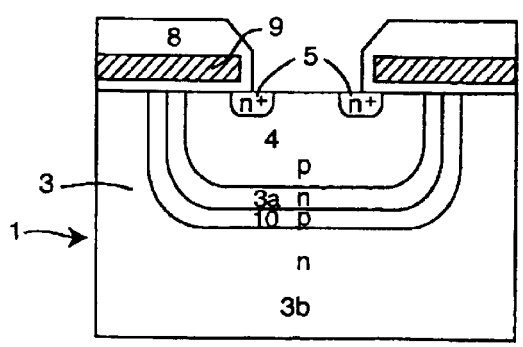
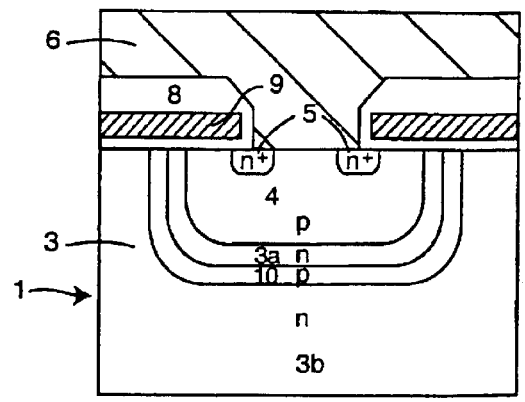

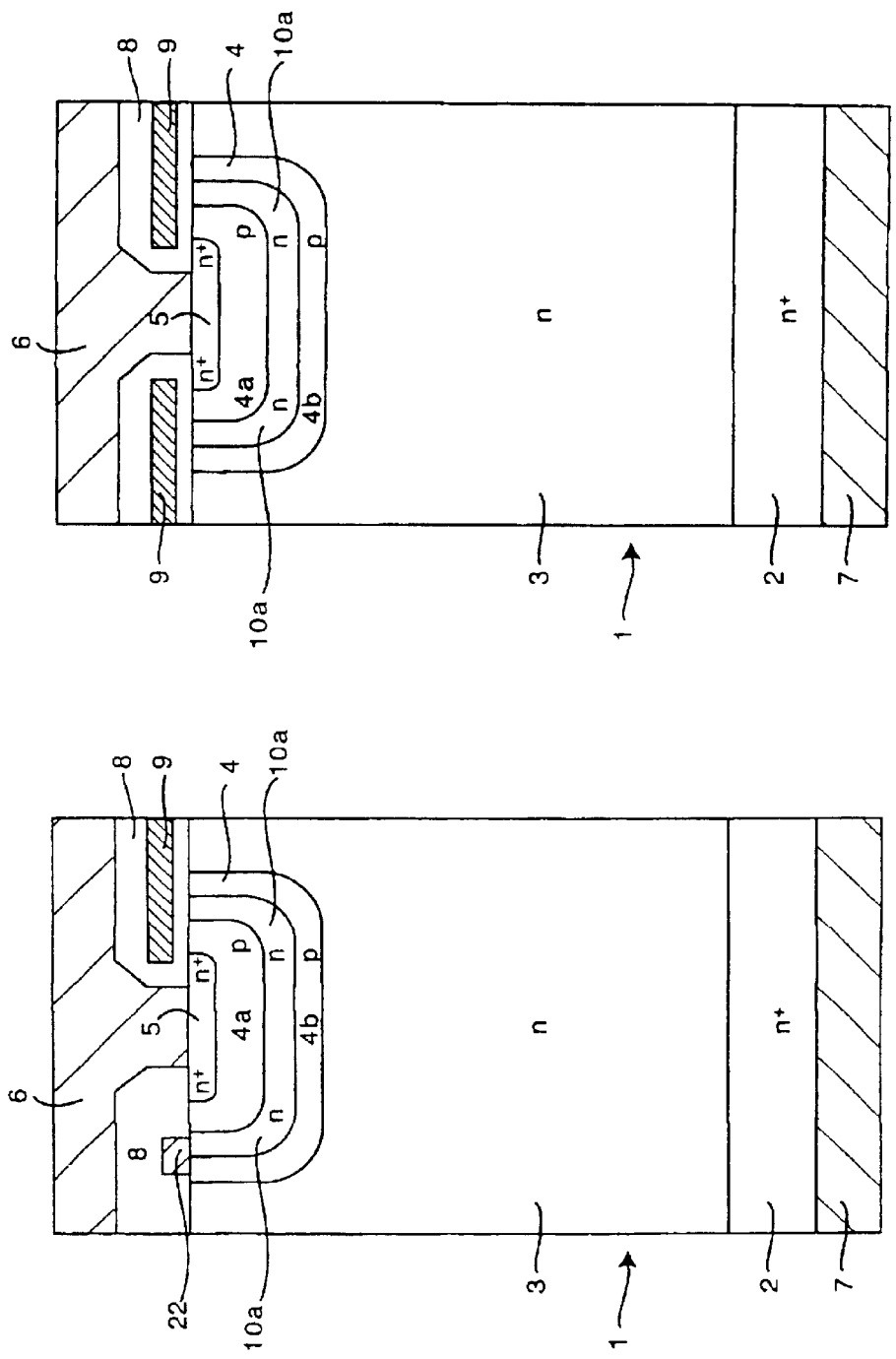

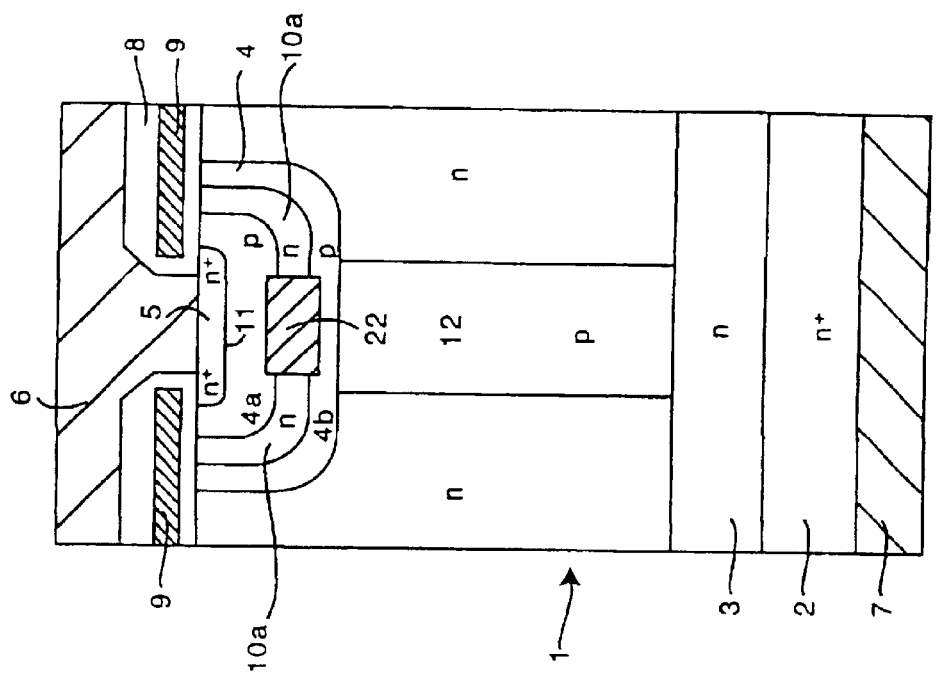
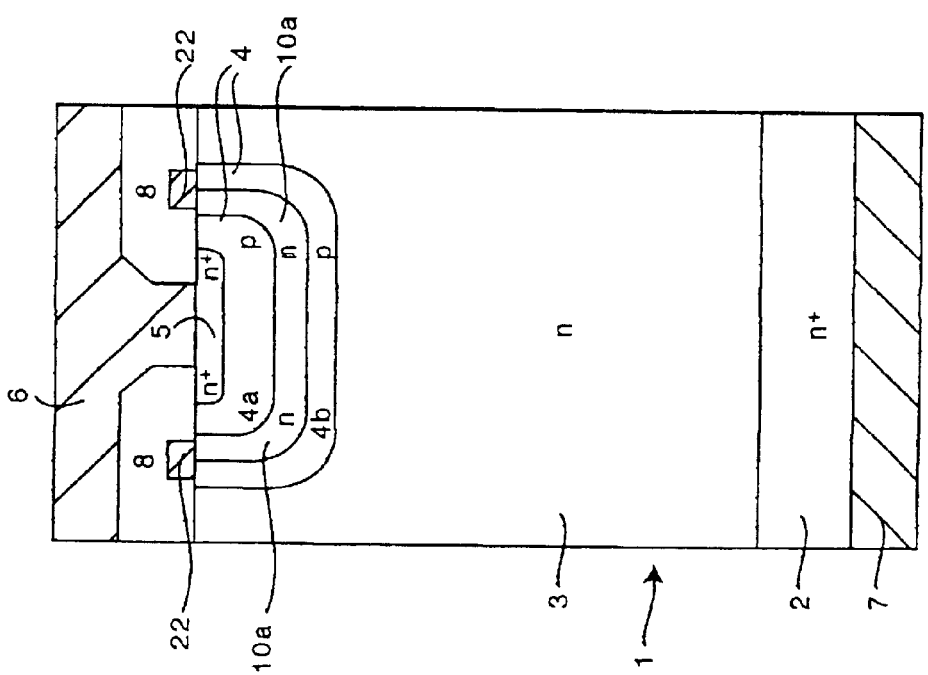

REVERSE-BLOCKING POWER SEMICONDUCTOR COMPONENT HAVING A REGION SHORT-CIRCUITED TO A DRAIN-SIDE PART OF A BODY ZONE

CROSS-REFERENCE TO RELATED APPLICATION

This application is a divisional of U.S. application Ser. No. 10/158,035, filed May 30, 2002, now abandoned.

BACKGROUND OF THE INVENTION

Field of the Invention

The present invention relates to power semiconductor components, compensation components, power transistors, and methods for producing power semiconductor components. The power semiconductor component has a drift path of a first conduction type disposed between two electrodes and to a method of producing these power semiconductor components.

Power transistors, such as DMOS transistors, UMOS or trench transistors, and similar semiconductor elements necessarily contain in their structure a "reverse diode" composed of a body region (also called a channel region) and a drain region. In numerous applications, this reverse diode is regularly operated in the flow direction, for example, as a freewheeling diode.

In the case of a reverse diode operated in the flow direction, a current flows through the MOS transistor in the reverse direction. This current in the reverse direction is not a channel current but a diode current associated with a high flood of charge carriers.

If the power transistor previously operated in the reverse or blocking direction is then switched over to the forward direction, then it absorbs voltage in the forward direction. For this purpose, the charge carriers specifically stored in the drift path of the power transistor have to be extracted from the semiconductor body of the power transistor. This process entails a high reverse diode current. Here, the reverse diode current adds to the load current of the power transistor and, in this application, leads to increased switching losses, for example in a second transistor which has to carry the entire current when it is turned on.

In compensation components like those described in U.S. Pat. No. 4,754,310 issued to Coe, the peak value of the reverse current (i.e., "the reverse current peak") is very high. A high reverse current peak is already accompanied by problems. In addition, the reverse current in compensation components returns to zero very suddenly and "breaks down". Break down necessarily includes stray inductances that can lead to dangerous overvoltage peaks.

Previously, in order to avoid the above difficulties, a Schottky diode has been connected in antiparallel with the power transistor. The Schottky diode has a lower threshold voltage than the pn-reverse diode of the power transistor. Accordingly, the Schottky diode can accept the reverse current if the Schottky diode has a sufficiently-small, overall forward voltage drop. However, this is barely possible, especially in the case of higher-value blocking semiconductor components, because the Schottky diode would require the same blocking ability as, for example, a power transistor.

A further, previously considered possibility for overcoming the above difficulties with power transistors is not to connect its body or channel region to the source contact. This allows the pn-junction between source region and body region to absorb the necessary reverse-blocking voltage.

In such a power transistor having a body region that is floating and not connected to the source contact is that, in the forward direction between collector and emitter with an open base, one disadvantage is preventing the breakdown of a parasitic npn-(or pnp-) transistor composed of the source region, the body region, and the drain region must be prevented. This is extremely difficult and complicated in technological terms. One possibility is to minimize the gain of this parasitic transistor with an inlaid recombination zone, for example, a floating metal or silicide contact. However, in such a case, the gain remains high in an interspace between such a recombination zone and the gate of the power transistor. For this reason, the interspace should be configured to be as small as possible, in order to prevent breakdown of the parasitic transistor (called the $U_{CEO}$ breakdown).

If the body region is not connected to the source contact, then it is not at a fixed potential. The turn-on voltage of the power transistor via the substrate control effect therefore depends on the drain-source voltage applied. In addition, a breakdown must be prevented between collector and emitter with open base of a parasitic npn-(or pnp-) transistor composed of the source region, the body region, and the drain region, which is difficult in technological terms.

U.S. Pat. No. 5,202,750 issued to Gough discloses an emitter switched thyristor, specifically an EST, as it is called, in which, an n-doped emitter region can be connected to the cathode or isolated from the latter via an MOS channel. This thyristor has on its rear, a p-doped region that acts as a p-doped emitter. This structure can switch off the thyristor, which has a very high conductivity as a result of charge carrier flooding with minority charge carriers and majority charge carriers, by driving the MOS channel via the associated gate.

SUMMARY OF THE INVENTION

It is accordingly an object of the invention to provide a power semiconductor component, a compensation component, a power transistor, and a method for producing power semiconductor components that overcome the hereinafore-mentioned disadvantages of the heretofore-known devices of this general type and that specifically provide a reverse-blocking power semiconductor component that, in the reverse direction, has a blocking capacity of at least a few volts, so that in the presence of a voltage in the reverse direction, no reverse diode current flows through the semiconductor component. In addition, the method of producing such a reverse-blocking power semiconductor component is to be specified.

With the foregoing and other objects in view, there is provided, in accordance with the invention, a reverse-blocking power semiconductor component. The reverse-blocking power component includes two electrodes, a drift path, a region, and a gate. The drift path of a first conduction type is disposed in an area between the two electrodes. The region is disposed in the drift path and subdividing the drift path into two areas. The region is of the other conduction type, opposed to the one conduction type. The gate is being provided with the region.

With the objects of the invention in view, there is also provided a method of producing the power semiconductor component. According to the method, the region that subdivides the drift path is produced by epitaxy.

The power semiconductor component according to the invention achieves its blocking capacity, which may be restricted to a few volts, in the reverse direction as a result of the fact that in the area of the drift path, an additional region doped opposite to the drift path is provided, so that the drift path is subdivided into two areas. If appropriate, more than just one such region may also be introduced into the drift path. The drift path is then accordingly subdivided into a plurality of areas. If, for example, two regions of the other conduction type, opposed to the conduction type of the drift path, are incorporated into the drift path, then there is a total of three areas, into which the drift path is subdivided.

In the following text, it will be assumed that the drift path is n-doped. In this case, the region inserted into the drift path is p-doped in order to subdivide it of course, however, the opposite conduction type may also be present in each case. This means that in this case a p-doped drift path is then subdivided into at least two areas by an n-doped region.

The p-doped (or n-doped) region inserted into the n-doped (or p-doped) drift path is not connected to the source contact or the body region. However, it divides the drift path into two completely mutually isolated areas, into n+1 areas in the case of n regions, so that at least one pn junction blocking in the reverse direction is produced between the p-doped region and the n-doped area on the source side of the drift path. In this case, in the case of a power transistor as a power semiconductor component, it is assumed that this drain is biased negatively with respect to its source.

Because this additional p-doped region also blocks the current flow in the forward direction in the case of a power transistor as a power semiconductor component, a second MOS gate disposed to produce an n-conducting channel, connecting the two areas of the drift path, in the inserted region. If there is a plurality of such regions, then the second MOS gate must be provided over these regions, so that all the areas of the n-doped drift path are connected by the n-conducting channel of this second MOS gate.

This second gate can be connected to the actual first gate, that is, the normal gate of the power transistor as an example of the power semiconductor component and in particular can be composed of its direct extension.

When the power semiconductor component is operated in the forward direction, the second gate is switched on together with the first gate. If the power semiconductor component is operated in the blocking direction (forward or backward), on the other hand, then both gates are switched off.

A substantial advantage of this reverse-blocking power semiconductor component according to the invention resides in the fact that its blocking capability in the forward direction remains unrestricted, and no collector-emitter breakdown of a parasitic npn-transistor composed of source, body, and drain occurs, and additionally that the body region remains at the fixed source potential, so that the turn-on voltage of the power semiconductor component does not depend, via the substrate control effect, on the drain-source voltage applied.

It is a second object of the present invention to provide a reverse-blocking power semiconductor component in which the body region is not connected, yet reliably prevents a $U_{CEO}$ breakdown of the parasitic transistor composed of source region, body region, and drain region is reliably prevented. In addition, the invention provides a method of producing a reverse-blocking power semiconductor component.

With the objects of the invention in view, there is also provided a reverse-blocking power semiconductor component including a semiconductor body, a body zone, a source metalization, and a body zone. The semiconductor body forms a drift path of one conduction type. The body zone of the other conduction type, opposed to the one conduction type, is provided in the semiconductor body. The source zone of the one conduction type placed in the body zone and connected to the source metalization. The region of the one conduction type is inlaid in the body zone to define a source-side part and a drain-side part in the body zone. The region inlaid in the body zone is short-circuited at least to the drain-side part of the body zone. The source metalization is connected electrically only to the source zone.

In the case of the power semiconductor component according to the invention of the second variant, the body region is not connected to the source metalization and is therefore floating. Therefore, it achieves a blocking capability in the reverse direction that may be restricted to a few volts.

However, in the forward direction, in the case of a floating body region, the breakdown voltage is reduced considerably with respect to a structure with a connected body region. The $U_{CEO}$ breakdown of the parasitic transistor composed of source region, body region, and drain region causes the reduction of the breakdown voltage.

The mechanism of the $U_{CEO}$ breakdown utilizes a blocking current produced in the spatial charging zone of the blocking pn junction between body region and drain region and enlarged as a result of avalanche generation or multiplication arrives in the body region as a hole current and therefore, as base current, drives the parasitic bipolar transistor. In turn, the parasitic bipolar transistor supplies an electron stream that is increased by the transistor gain of the parasitic transistor. In turn, the electron stream flows through the body region into the spatial charging zone, where avalanche generation restarts the multiplication process.

In order then to prevent the $U_{CEO}$ breakdown of the parasitic bipolar transistor composed of source region, body region, and drain region in the forward direction, the feedback mechanism for the multiplication process is interrupted in accordance with the invention.

In the following explanation, it will be assumed that the drift path of the power semiconductor component is n-doped, while the body region exhibits p-doping. Of course, however, converse conduction types are also possible.

In the body region, which in the present case is to be p-doped, an additional n-doped region (in the case of an n-doped body region, an additional p-doped region) is inlaid. The additional n-doped region is inlaid in such a way that electrons that come from the source region do not have a continuous path in the p-doped body region as far as the spatial charging zone of the blocking pn junction between body region and drain region. This additional region, n-doped in the present case, is connected electrically by a purely resistive or non-rectifying connection. Preferably, the connection includes, in particular, a metal contact, at least to the drain-side part of the body region subdivided by the additional region. In addition, a purely resistive connection can be disposed between the additional region and the source-side part of the body region.

Electrons that come from the source region, in the case of the power semiconductor component according to the invention, are intercepted by the additional region inlaid in the body region. Because the pn junction is definitely short-circuited, these electrons no longer can overcome the pn junction to the drain-side part of the body region as minority charge carriers.

In the case of the reverse-blocking power semiconductor component, the blocking capability in the forward direction is maintained unrestrictedly, because no $U_{CEO}$ breakdown occurs. Likewise, a $U_{CEO}$ breakdown can be prevented In the reverse direction. If the additional region inlaid in the body region is also short-circuited to the source-side part of the body region.

As previously discussed, the additional region is intended to be n-doped and is inlaid in the body region. The additional region functions as a collector of the respective parasitic bipolar transistor composed of source region, body region, and additional region in the case of blocking loading in the forward direction or, respectively, of drain region, body region, and additional region in the case of blocking loading in the reverse direction, and therefore collects electrons. Therefore, diffusion of the electrons toward the blocking pn junction between source region and body region is prevented.

As a result of the additional region inlaid in the body region, the feedback mechanism causing the $U_{CEO}$ breakdown as a result of multiplication in the spatial charging zone and the gain of the parasitic bipolar transistor is interrupted in a straightforward manner. The additional inlaid region intercepts the electrons emitted from the source region accomplishes this.

The invention includes a mode of operation of the reverse-blocking power transistor. An example of the reverse-blocking power transistor may be represented as a body region that is p-doped and the inlaid region that has the n-doping. The parasitic npn bipolar transistor composed of source region, body region, and drain region is subdivided into two series-connected npn transistors by the additional n-doped region inlaid in the body region. Of these two npn transistors, the first transistor, composed of the inlaid n-doped region, the body region, and the drain region, is operated with emitter-base short circuit, so that this first transistor has its full blocking capability. On the other hand, the other, second transistor composed of source region, body region, and inlaid n-doped region is brought into $U_{CEO}$ operation. Or, if the additional, inlaid n-doped region is also short-circuited to the source-side part of the body region, the second transistor is operated as a diode in the forward direction. Therefore, the second transistor has only a low or even no blocking capability; however, it does not need any such capability.

The power semiconductor component has a blocking capability of at least a few volts in the reverse direction, so that under a reverse voltage, no diode current flows through the power semiconductor component. In this case, the current can flow readily through an antiparallel-connected pn diode or Schottky diode with appropriate characteristics.

The power semiconductor component according to the invention, depending on the thickness and doping of the drift path, can block in the forward direction approximately between 30 and 1000 V. The drift path can then have doping between about $2 \cdot 10^{16}$ charge carriers/cm$^3$ and $1 \cdot 10^{14}$ charge carriers/cm$^3$, and can have a thickness of about 2 μm to 100 μm.

The power semiconductor component according to the invention is preferably a power transistor. However, the invention can also be applied in the same way to other power semiconductor components, such as IGBTs (bipolar transistors with isolated gate) and thyristors.

The semiconductor body of the power semiconductor component according to the invention is preferably composed of silicon. Instead of silicon, other suitable semiconductor materials, such as SiC, $A_{III}B_V$ and so on can also be used.

A preferred area of application for the present invention is compensation components, in which compensation regions of the conduction type opposed to the conduction type of the drift path are inlaid in the latter. The compensation regions can be floating or connected to the body region.

The additional region inlaid in the body region can also be referred to as an "electron collector". This electron collector is short-circuited at least to the drain-side part of the body zone and preferably to the source-side part of the latter, which can be done through a metallic short-circuit by a metal contact or plug.

It is not necessary for there to be semiconductor material, in particular silicon, above the metallic short circuit or metal plug between the body region and the inlaid, additional region. It is also not important precisely where the metallic short circuit or metal plug is disposed. The metallic short circuit or metal plug also can be provided on the surface of the semiconductor body.

While, in the first variant of the power semiconductor component according to the invention, the drift path is "subdivided", in the case of the second variant there is a "subdivision" of the body zone. The drift zone and body zone also can be subdivided in each case to create a third variant.

Other features which are considered as characteristic for the invention are set forth in the appended claims.

Although the invention is illustrated and described herein as embodied in a power semiconductor component, a compensation component, a power transistor, and a method for producing power semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 11 is a sectional view showing an eleventh embodiment of the first variant of a reverse-blocking power transistor in SOI technology (SOI=silicon-on-insulator);

FIG. 12 is a sectional view showing a twelfth embodiment of the first variant of a reverse-blocking power transistor with a buried oxide layer;

FIGS. 13a to 13f are sectional views showing a method for producing the planar power transistor of the first embodiment of FIG. 1;

FIG. 16 is a sectional view showing a third embodiment of the second variant of a planar power transistor with reverse-blocking capability;

FIGS. 17a and 17b are sectional views showing a fourth embodiment of the second variant of a planar power transistor with reverse-blocking capability in two planes, lying one behind the other;

FIG. 18 is a sectional view showing a fifth embodiment of the second variant of a reverse-blocking planar power transistor with a compensation structure;

FIG. 15) of the second variant of a method for manufacturing the power transistor.

DESCRIPTION OF THE PREFERRED EMBODIMENTS

Figure 1:
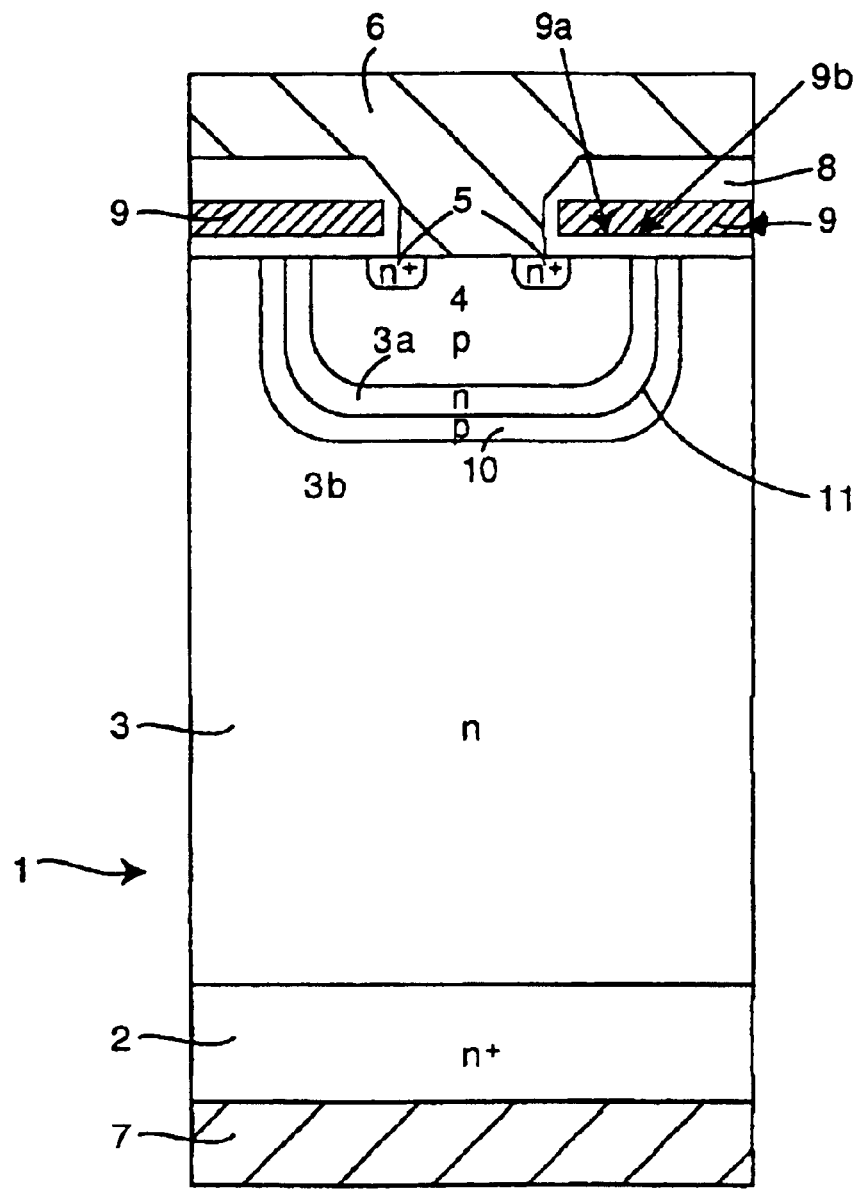
FIG. 1 is a sectional view showing a first embodiment of a first variant of a planar power transistor with reverse-blocking capability.

In all the figures of the drawing, sub-features and integral parts that correspond to one another bear the same reference symbol in each case.

In addition, in all the exemplary embodiments of the first variant of the invention (FIGS. 1–13), it will be assumed that the drift path is n-doped, so that the region subdividing the drift path into two areas has p-doping. Of course, dopings of the respectively opposite conduction type are also possible here.

In addition, the invention will preferably be described using power transistors. However, it can be applied in the same way to other power semiconductor components, such as IGBTs (bipolar transistors with isolated gate), diodes, and thyristors.

Finally, in the following exemplary embodiments, the semiconductor bodies of the individual semiconductor components are in each case composed of silicon. Instead of silicon, however, another suitable semiconductor material, such as SiC, $A_{III}B_V$ and so can also be used.

Referring now to the figures of the drawings in detail and first, particularly to FIG. 1 thereof, there is shown a silicon body 1 including an $n^+$-doped silicon substrate 2 and an n-doped semiconductor layer 3 provided thereon. A p-doped body zone 4 lies in the semiconductor layer 3. The p-doped body zone 4 contains an $n^+$-doped source zone 5.

The body zone 4 and the source zone 5 are provided with a first metalization 6 as a source contact, while a second metalization 7 is applied, as a drain contact, to the surface of the silicon substrate 2. In an insulating layer 8 of silicon dioxide, for example, a gate electrode 9 of polycrystalline silicon, for example, is embedded in the insulating layer 8 in the area above the interspace between the source zone 5 and the semiconductor layer 3, that is to say in the area above the body zone 4.

A planar power transistor described to this extent is of conventional construction.

According to the invention, there is now in the semiconductor layer 3 a further p-doped region 10, which subdivides the semiconductor layer 3 that forms a drift path into a source-side drift path 3a and a drain-side drift path 3b.

In the case of this planar power transistor, a reverse-blocking pn junction 11 is therefore located between the source-side drift path 3a and the region 10.

In addition, the gate electrode 9 includes two parts: a first gate 9a lies between the source zone 5 and the source-side part 3a, while a second gate 9b is placed above the region 10. Accordingly, the gate electrode can also actually include two isolated parts (9a and 9b).

Depending on the thickness and doping of the semiconductor layer forming the drift path with its parts 3a and 3b, the planar power transistor of the exemplary embodiment of FIG. 1 can block a voltage in the forward direction approximately between 30 and 1000 V. The drain-side part 3b of the drift path can have a doping between about $2 \cdot 10^{16}/cm^3$ and $1 \cdot 10^{14}/cm^3$ and a thickness of about 2 µm to 100 µm. The source-side part 3a of the drift path can have the same doping level or be more highly doped than the drain-side part 3b. In order not to impair the forward blocking capability, the area charge contained between the p-doped areas, that is between the p-doped doped body zone 4 and the p-doped region 10, must not exceed the breakdown charge, which is around $1 \cdot 10^{12}/cm^2$ in the case of silicon, in the entire area of a cell. It should be noted that the breakdown charge is linked to the breakdown voltage via the second Maxwell equation.

Instead of the region 10, a plurality of such regions can also be inserted into the drift path: i.e., the semiconductor layer 3. This region 10 is not connected to the first metalization 6, that is to say the source contact, or the body zone 4. However, it subdivides the drift path into the two completely mutually isolated parts 3a and 3b, so that the pn junction 11 that blocks in the reverse direction (drain is negative with respect to source here) is produced between the region 10 and the source-side drift path 3a.

Because this additional region 10 also blocks the current flow in the forward direction, the second gate 9b is disposed to produce an n-conducting channel, connecting the two areas 3a, 3b of the drift path, in the surface area of the region 10. This second gate 9b can be connected to the first gate 9a. That is, the "normal" gate of the power transistor and, for example as shown in FIG. 1, can be composed of its direct extension. However, separate configuration of the two gates 9a, 9b is also possible.

In the forward mode of the power transistor, the second gate 9b is switched on together with the first gate 9a, while in the blocking mode in the forward or reverse direction, both gates 9a and 9b remain switched off.

A substantial advantage of the power semiconductor component according to the invention resides in the fact that its blocking capability in the forward direction is maintained unrestrictedly, so that no breakdown occurs between collector and emitter of a parasitic transistor, and additionally in the fact that the body zone 4 is at the fixed potential of the first metalization 6, that is, source potential, so that the turn-on voltage does not depend, via the substrate control effect, on the applied drain-source voltage of the power transistor.

Figure 2:
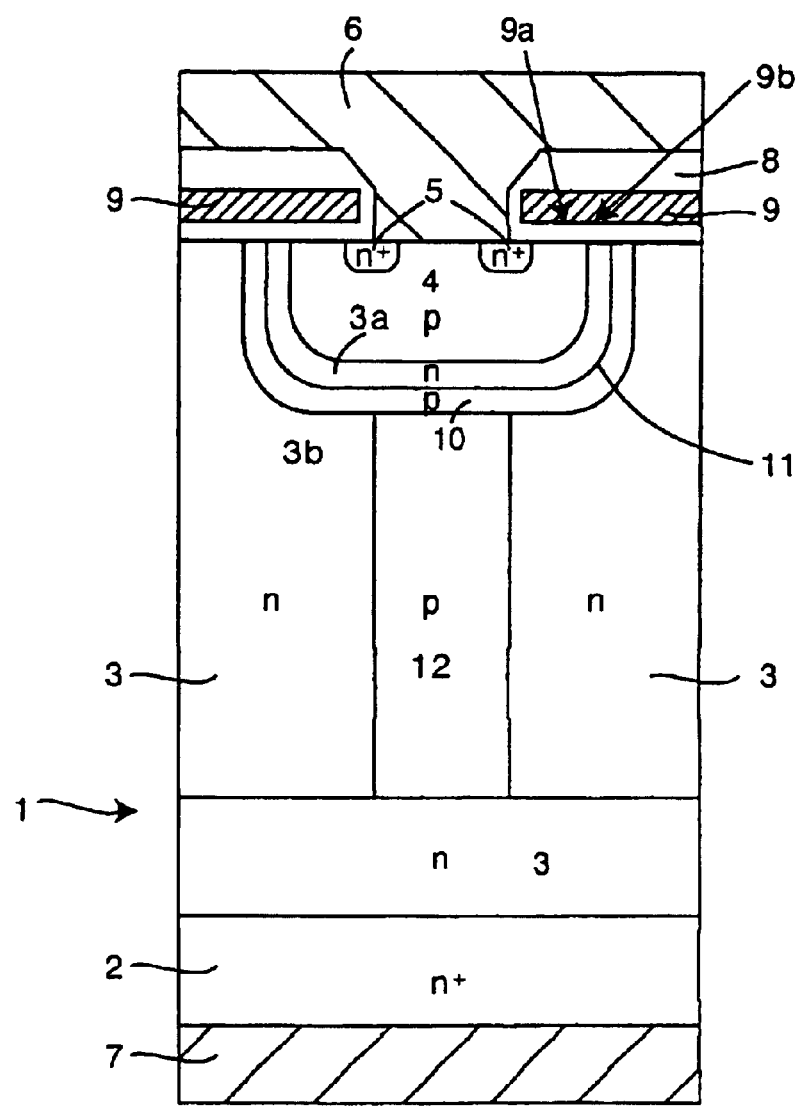
FIG. 2 is a sectional view showing a second embodiment of the first variant of a reverse-blocking planar power transistor with compensation structure.

FIG. 2 shows a further exemplary embodiment of the power semiconductor component according to the invention. Here, however, as opposed to the exemplary embodiment of FIG. 1, the power transistor is provided with a compensation structure. Therefore, in the n-doped semiconductor layer 3 there is at least one p-doped compensation pillar 12 that is so highly doped that, in the blocking mode, the charge carriers of the compensation pillar 12 and the charge carriers of the semiconductor layer 3 surrounding the latter deplete one another. Otherwise, reference is made to U.S. Pat. No. 4,754,310, which was previously cited, for details relating to compensation components.

Figure 3:
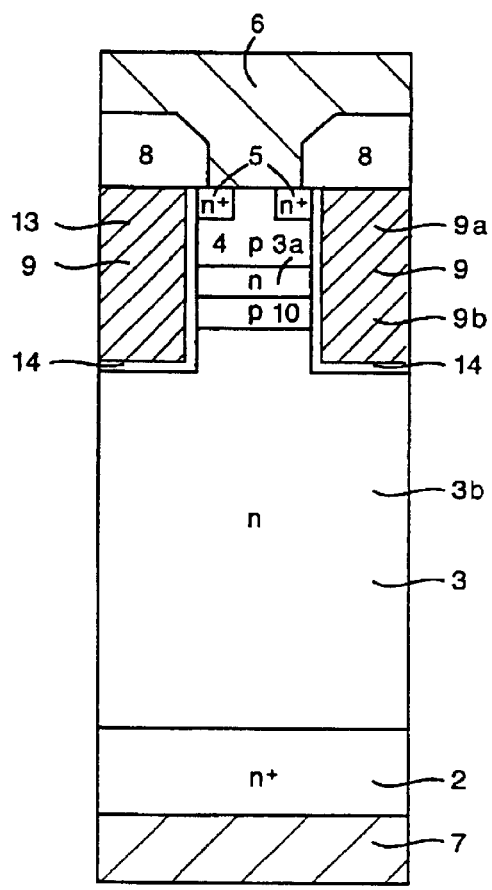
FIG. 3 is a sectional view showing a third embodiment of the first variant of a trench power transistor with reverse-blocking capability.

In FIG. 3, a trench power transistor with reverse-blocking capability is illustrated schematically. To distinguish the embodiments of FIGS. 1 and 2, in the embodiment of FIG. 3, the gate electrode 9 is located in a trench 13, which is lined with a gate insulating layer 14 of silicon dioxide, for example. Here, too, the uniformly shaped gate electrode 9 can be divided into a first gate 9a in the area of the body zone 4 and a second gate 9b in the area of the region 10.

Figure 4:
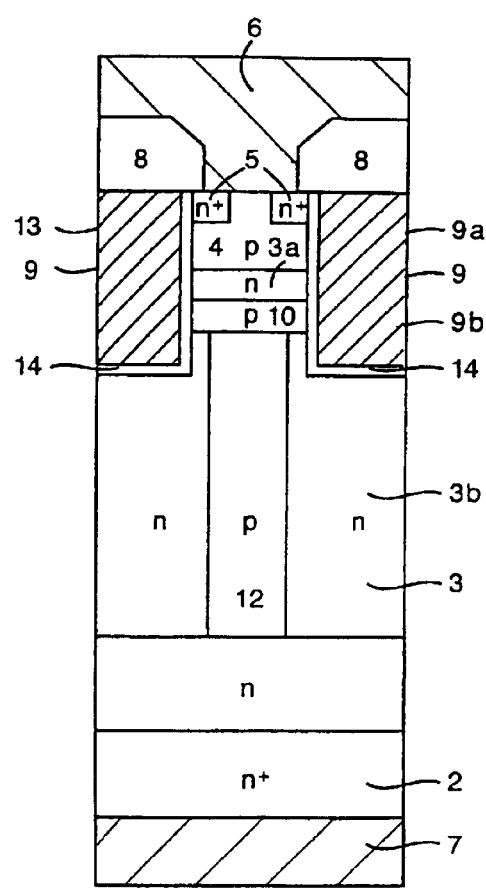
FIG. 4 is a sectional view showing a fourth embodiment of the first variant of a reverse-blocking trench power transistor with compensation structure.

In a fourth exemplary embodiment in FIG. 4, a trench power transistor with reverse-blocking capability is again illustrated, as in FIG. 3. However, like the exemplary embodiment of FIG. 2, this power transistor of the exemplary embodiment of FIG. 4 has a compensation structure. This means that there is a p-doped compensation pillar 12 in the otherwise n-doped semiconductor layer 3 of the drift path.

Other configurations can also be selected for the compensation structure. Exemplary embodiments of this are shown in FIGS. 5 and 6.

Figure 5:
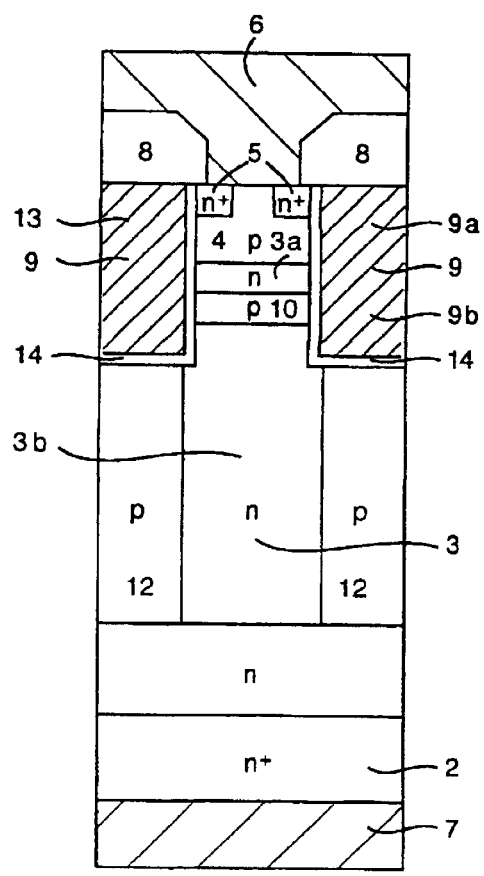
FIG. 5 is a sectional view showing a fifth embodiment of the first variant of a reverse-blocking trench power transistor with compensation structure.

In the exemplary embodiment of FIG. 5, the compensation pillars 12 do not adjoin the p-doped region 10, as in the exemplary embodiment of FIGS. 2 and 4. Instead, here the compensation pillars 12 are disposed laterally "at the sides", substantially underneath the gate electrodes 9.

Figure 6:
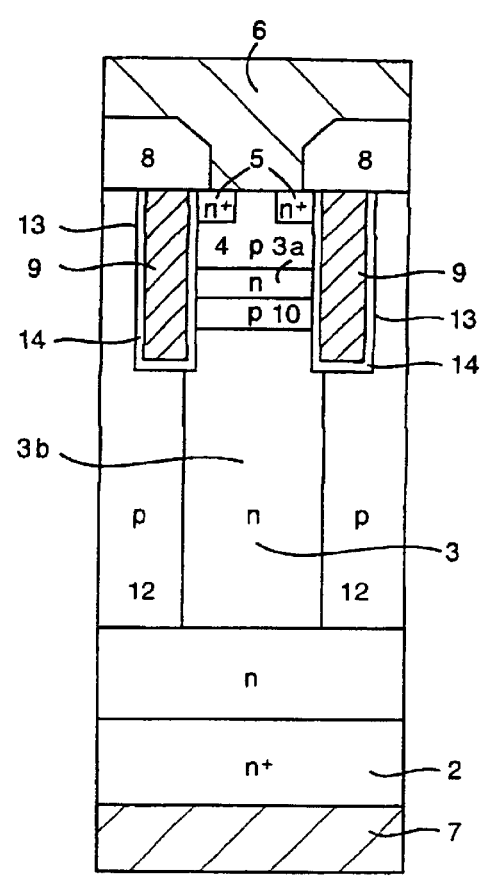
FIG. 6 is a sectional view showing a sixth embodiment of the first variant of a reverse-blocking trench power transistor with compensation structure.

In the exemplary embodiment of FIG. 6, the compensation columns 12 are led laterally further past the trenches 13 and reach as far as the surface of the silicon body 1 underneath the insulating layer 8.

Still further, different configurations are possible for the compensation structure. For example, the compensation pillars may be floating, as a whole or partially and can be connected to the region 10, as a whole or partially. Furthermore, the compensation pillars can be coherent or else individually configured on their own. In addition, instead of compensation pillars, individual p-conducting regions, which are not coherent in DC terms, can be inlaid in the n-conducting drift path.

The turn-on voltage of the parasitic p-channel transistor composed of the body zone 4, the drain-side drift path 3a and the region 10 (cf. FIG. 1, for example) should be increased in numerous applications and should be at least as high as the value of the desired reverse-blocking capability of the power transistor. Such an increase in the turn-on voltage can be achieved with the exemplary embodiments of FIGS. 7 to 10.

Figure 7:
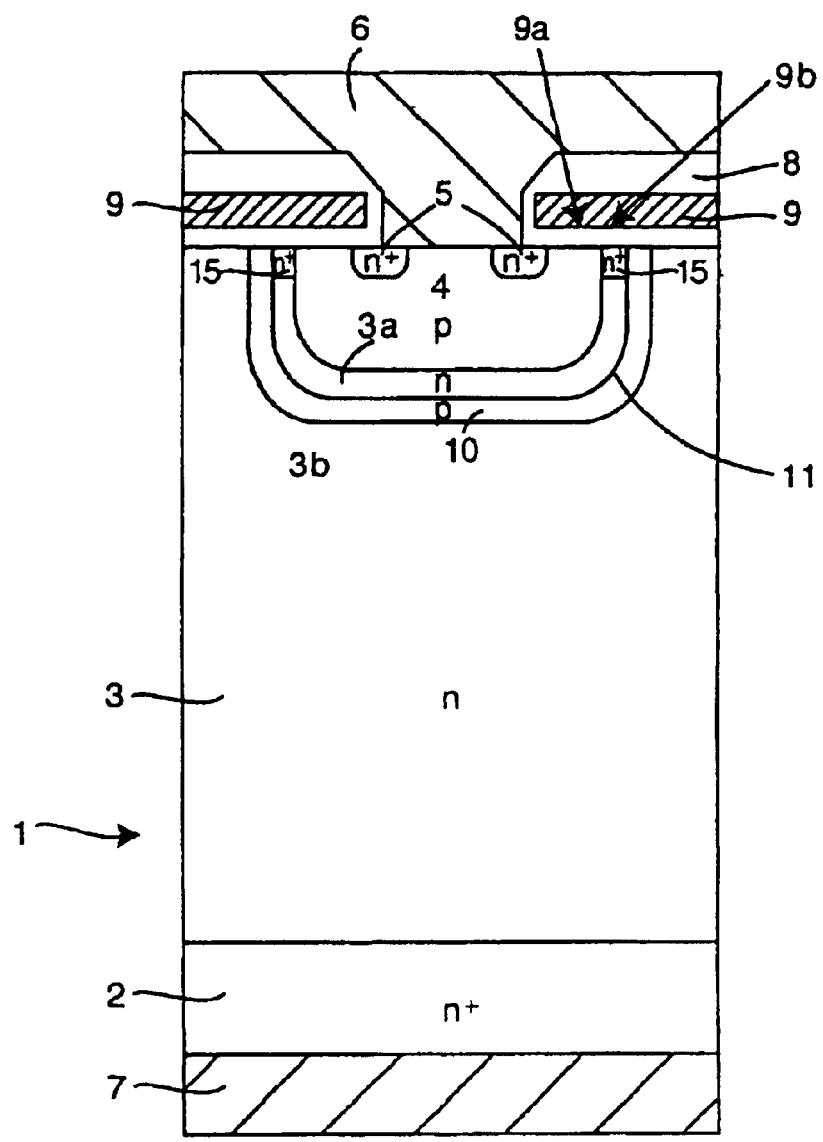
FIG. 7 is a sectional view showing a seventh embodiment of the first variant of a reverse-blocking planar power transistor with increased n-doping near a parasitic p-channel transistor.

In the exemplary embodiment of FIG. 7, which otherwise corresponds to the exemplary embodiment of FIG. 1, increased n-doping is provided in the area of the parasitic p-channel transistor. This means that the surface areas of the source-side drift path 3a, that is to say source regions 15, are more highly doped than the rest of the source-side drift path.

Figure 8:
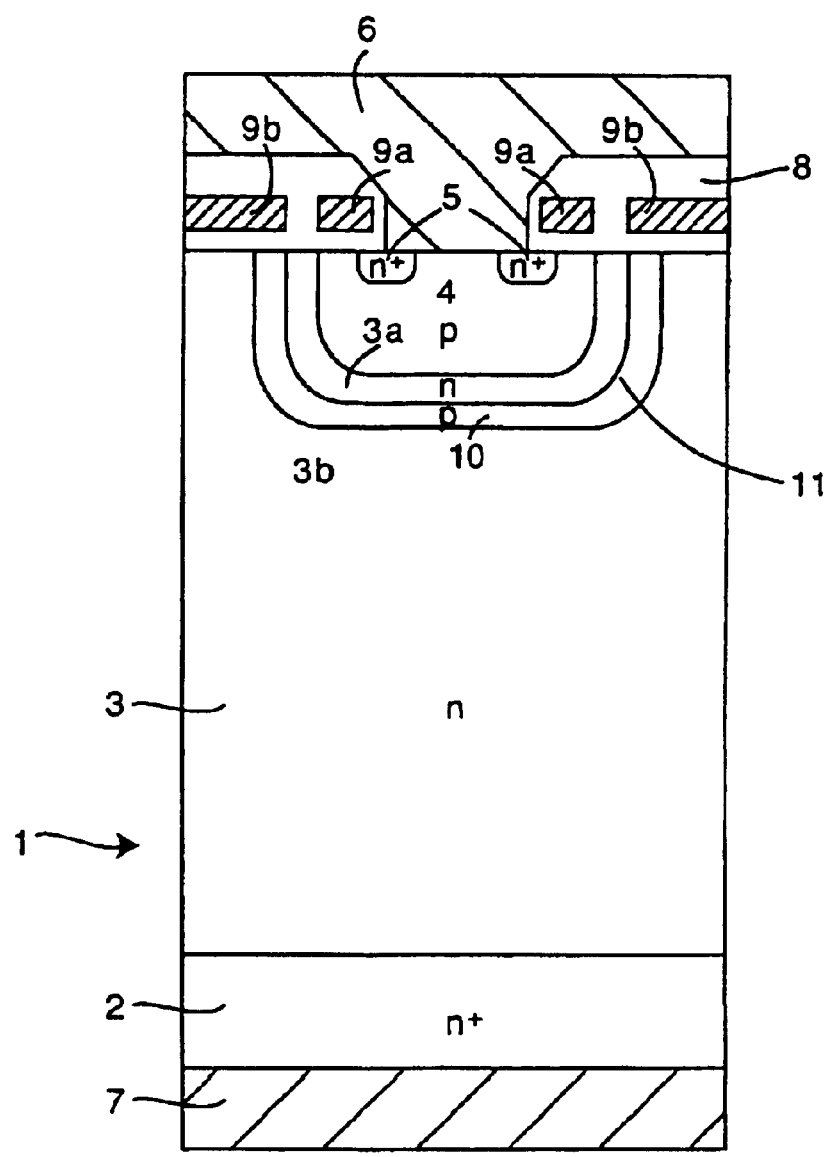
FIG. 8 is a sectional view showing an eighth embodiment of the first variant of a reverse-blocking planar power transistor with interrupted gate.

Another possible way of increasing the turn-on voltage of the parasitic p-channel transistor can be seen from the exemplary embodiment of FIG. 8: there, in the area above the source-side drift path 3a, the gate electrode 9 is interrupted, so that here there are actually two isolated gates 9a and 9b. The gate 9a forms the actual gate of the power transistor, while the gate 9b, the upper, second gate, is used to supply the two areas 3a and 3b of the drift path with a connecting n-conducting channel.

Figure 9:
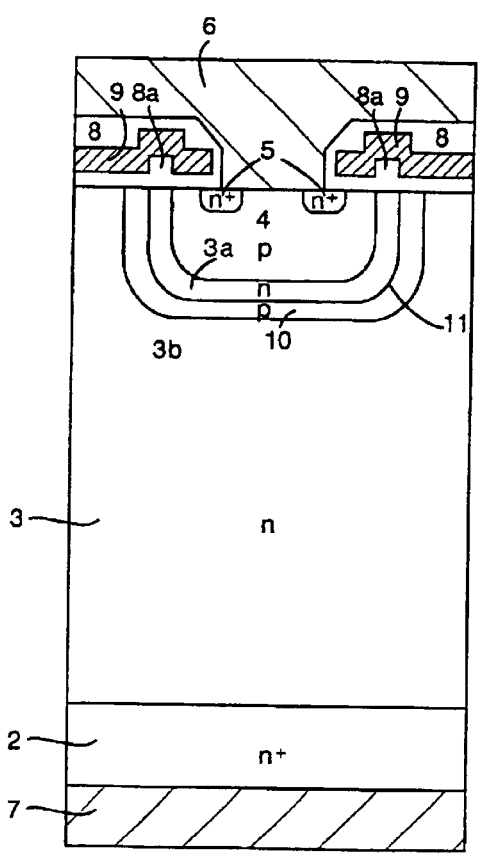
FIG. 9 is a sectional view showing a ninth embodiment of the first variant of a reverse-blocking planar power transistor with increased insulating layer thickness near a parasitic p-channel transistor.

In the exemplary embodiment of FIG. 9, the layer thickness of the insulating layer 8 is increased in the area of the source-side drift path 3a, so that here there is a thickened area 8a. Accordingly, the gate electrode 9 in this area is provided at a greater distance from the drift path 3a.

Figure 10:
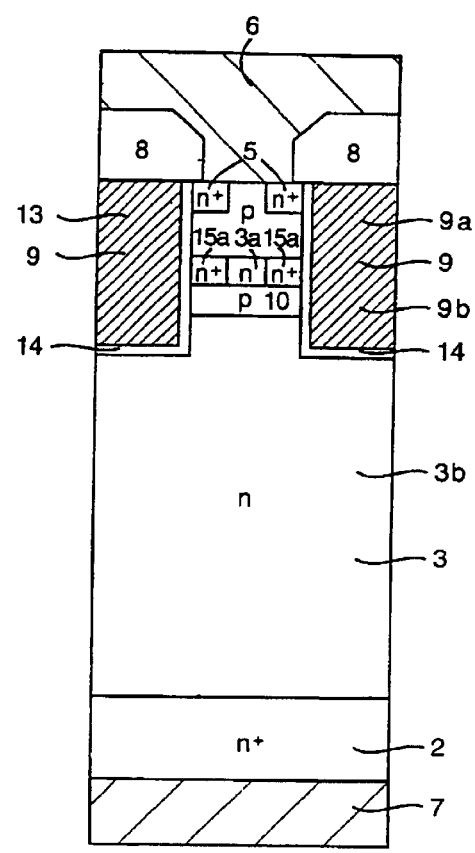
FIG. 10 is a sectional view showing a tenth embodiment of the first variant of a reverse-blocking trench power transistor with increased n-doping near a parasitic p-channel transistor.

FIG. 10 shows an exemplary embodiment corresponding to FIG. 3. In a similar way to that in the exemplary embodiment of FIG. 7, FIG. 10 shows that the doping of the source-side area of the drift path 3a is increased in regions 15a.

The various possible ways of increasing the turn-on voltage of the parasitic p-channel transistor, which have been described above by using FIGS. 7 through 10, can, if required, also be used simultaneously: for example by the first gate 9a and the second 9b (cf. FIG. 8), in an area of a thicker insulating layer (cf. reference symbol 8a in FIG. 9) being connected via the source-side area 3a of the drift path. This connection can be left out in the area of a thinner insulating layer.

The structures of power transistors explained above by using FIGS. 1 to 10, can be implemented as configurations of strip cells, square cells, hexagonal cells, or other cell shapes. In each case, they can be connected in parallel with one another.

A further two fundamentally further different exemplary embodiments of the power semiconductor component according to the invention are illustrated in FIGS. 11 and 12.

Thus, FIG. 11 shows a power transistor in SOI technology. The power transistor is disposed above an oxide layer 17 on a carrier wafer 16 and embedded in a further oxide layer 18. Here, the drift path includes the source-side area 3a and the drain-side area 3b, which are separated from each other by the p-doped region 10. An n$^+$-doped connecting region 19 serves, in a similar way to the silicon substrate 2, to provide good contact with the second metalization or drain electrode 7.

Finally, the reverse-blocking power transistor of the exemplary embodiment of FIG. 12 has a buried insulating layer 20 of silicon dioxide, for example. The drift path of this power transistor is separated by the p-conducting region 10 into the source-side part 3a and the drain-side part 3b. In this exemplary embodiment, too, the gate electrode 9 again extends, as a first gate 9a, over the channel of the actual power transistor and, as a gate 9b, over the region 10.

In the following text, a method of producing the power semiconductor component according to the invention is to be explained using FIGS. 13a to 13f.

First of all, as shown in FIG. 13a, a semiconductor body 1 composed of an n$^+$-doped silicon substrate 2 and an n-doped semiconductor layer 3 deposited thereon are provided. The semiconductor layer 3 is therefore weaklier doped than the silicon substrate 2. This is followed by gate oxidization with formation of a gate insulating layer 21 of silicon dioxide and gate electrodes 9 of doped polycrystalline silicon, which are both structured in the usual way by etching, as shown in FIG. 13a.

Then, as illustrated in FIG. 13b, the p-doped region 10 separating the two areas 3a and 3b of the drift path are introduced by ion implantation of boron, for example, which is followed by further implantation of phosphorus, for example, in order to produce an n-conducting area 3a', from which the source-side part 3a of the drift path is later produced. Following outward diffusion of boron and phosphorus, the structure illustrated in FIG. 13b is therefore present.

Depending on the desired doping levels, penetration depths and dopants used, boron and phosphorus in the present example, the areas 10 and 3a' can be produced in one order or the other or, if appropriate, also together.

Then, in the usual way, a p-doped body zone 4 is introduced by implantation and outward diffusion of boron, for example, as a result of which the structure illustrated in FIG. 13c is obtained.

By ion-implanting of phosphorus, for example, and subsequent healing, an n$^+$-doped source zone 5 is then produced. The structure illustrated in FIG. 13d is then present.

This is further followed by the deposition of an intermediate oxide to form the insulating layer 8 of silicon dioxide that sheaths the gate electrodes 9, and the etching of a contact hole, so that the structure of FIG. 13e is present. Finally, a further metalization 6 is applied as a source electrode in order to arrive at the structure shown in FIG. 13f and corresponding to the exemplary embodiment of FIG. 1.

During the production of the trench power transistor from the exemplary embodiment of FIG. 3 and other trench power transistors, the various doping regions can be produced in a manner corresponding to that in FIG. 13 or else by a plurality of epitaxial steps. For example, it is possible to produce the two p-conductive regions, namely the body zone 4 and the region 10, firstly as a coherent region by epitaxy or implantation and diffusion, and then to introduce the source-side part 3a of the drift path by high-energy implantation. If a slow-diffusing dopant is used for this source-side part 3a of the drift path, such as arsenic or antimony, the implantation can even be conducted before the diffusion of the body zone 4. Finally, it is also still possible to produce the region 10 by of high-energy implantation, for example.

Figure 14:
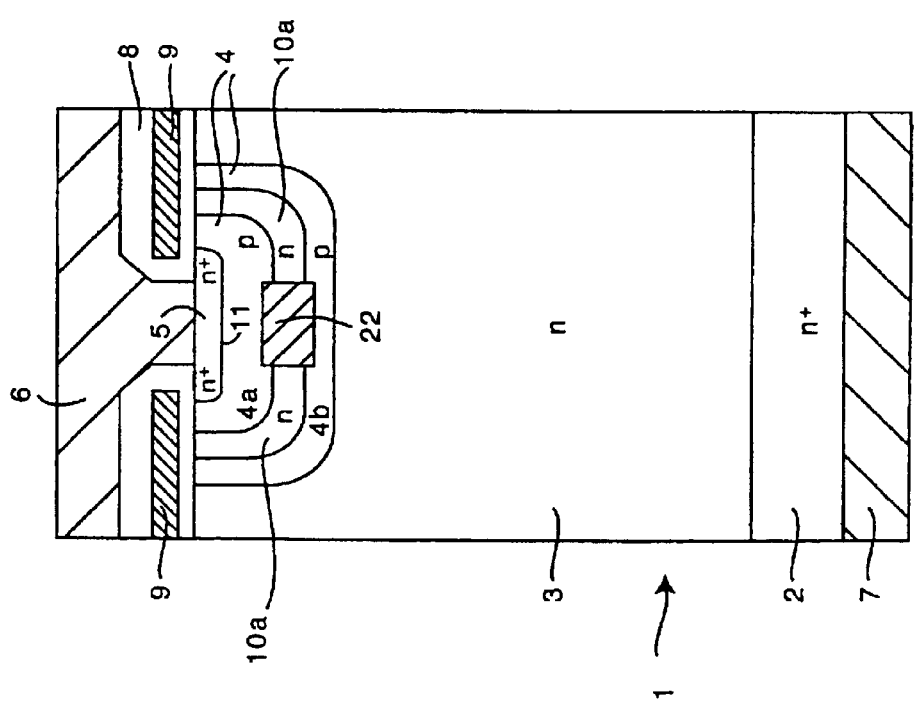
FIG. 14 is a sectional view showing a first embodiment of the second variant of a planar power transistor with reverse-blocking capability.

FIG. 14 shows a silicon body 1 including an n$^+$-doped silicon substrate 2 and an n-doped semiconductor layer 3 provided thereon. In the semiconductor layer 3 there is a p-doped body zone 4 that contains an n$^+$-doped source zone 5.

The source zone 5 is provided with a first metalization 6 of aluminum, for example, as a source contact, while a second metalization 7 also of aluminum, for example, is applied as a drain contact to the surface of the silicon substrate 2. A gate electrode 9 of polycrystalline silicon, for example, is embedded in an insulating layer 8 of silicon dioxide, for example.

The planar power transistor described to this extent is of conventional construction.

According to the invention, there is now in the body zone 4 a further additional, n-doped region 10a, which subdivides the body zone into a source-side part 4a and a drain-side part 4b.

The additional n-doped region 10a inlaid in the body zone 4 is connected, via a metal plug 22 of aluminum, for example, or a silicide or another suitable material, at least to the drain-side part 4b of the body zone 4, in a purely resistive, non-rectifying connection, and is likewise preferably also connected electrically to the source-side part 4a of the body zone 4.

In the case of this planar power transistor, there is a reverse-blocking pn junction 11 between the source-side part 4a of the body zone 4 and the source zone 5.

The effect of the additional region 10a that is inlaid in the body zone 4 is that electrons that come from the source zone 5 do not find a continuous path in the body zone 4 as far as the spatial charging zone of the blocking pn junction between the body zone 4 and the semiconductor layer 3 forming the drain. Electrons that come from the source zone 5 are therefore intercepted by the region 10a and can no longer overcome the pn junction to the drain-side part 4b of the body zone 4 as minority charge carriers, since this junction is short-circuited by the metal plug 22.

Figure 15:
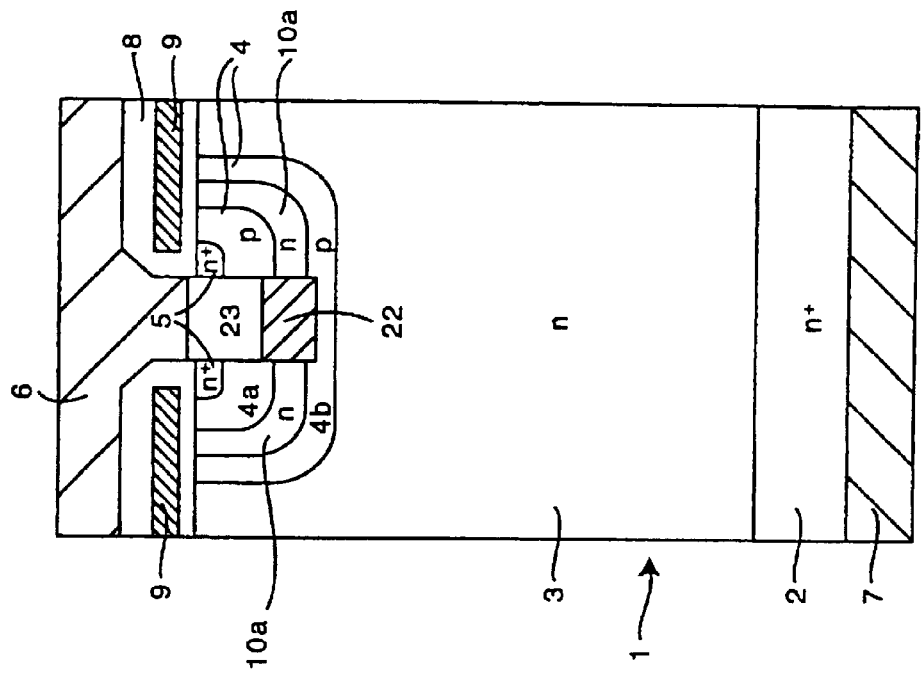
FIG. 15 is a sectional view showing a second embodiment of the second variant of a planar power transistor with reverse-blocking capability.

Above the metallic short circuit resulting from the metal plug 22 between the body zone 4 and the region 10a, it is not necessary for semiconductor material or silicon to be present. Instead, this metallic short circuit can be displaced underneath an insulating layer 23 of silicon dioxide, for example, or else onto the semiconductor surface into the insulating layer 8. Exemplary embodiments of this are shown in FIGS. 15 and 16. In FIG. 15, the metal plug 22 forming the metal short circuit is located underneath an oxide layer 23 composed of silicon dioxide. In the exemplary embodiment of FIG. 16, the metallic short circuit has been displaced to the surface of the semiconductor body. An aluminum layer forming the metal plug 22 here produces a conductive connection between the source-side part 4a of the body zone 4, the region 10a and the drain-side part 4b of the body zone 4. One advantage of the exemplary embodiments of FIGS. 15 and 16 is that these can be produced more easily, because it is simpler to produce the metallic short circuit under an oxide layer as in the exemplary embodiment of FIG. 15, or on the semiconductor surface, as in the exemplary embodiment of FIG. 16.

FIGS. 17a and 17b show an exemplary embodiment that is similar to FIG. 15. In the exemplary embodiment of FIG. 16, the metallic short circuit resulting from the metal plug 22 is displaced, for example, to one side of a strip-like power transistor, and its other side has the gate electrode 9. In the exemplary embodiment of FIGS. 17a and 17b, the subdivision between the metallic short circuit and gate electrode is conducted differently. Here, the gate electrode 9 is in a front (or rear) area of the strip-like power transistor, while the metallic short circuit resulting from the metal plug 22 is displaced to the rear (or front) area of the power transistor.

The exemplary embodiments of FIGS. 15, 16, 17a, and 17b demonstrate that the metallic short circuit between the region 10a inlaid in the body zone 4 and dividing the latter into two parts 4a and 4b, and at least the drain-side part 4b of the body zone 4 can be shaped virtually as desired. It is merely essential that there is such a metallic short circuit present in any case between the inlaid region 10a and at least the drain-side part 4b, preferably the source-side part 4a of the body zone 4.

In FIGS. 18 to 22, there are further exemplary embodiments of the power semiconductor component according to the invention of the second variant, in the form of power transistors with compensation structure and/or a gate disposed in a trench (trenchgate).

In detail, FIG. 18 shows an exemplary embodiment of a reverse-blocking planar power transistor with compensation structure. This power transistor has a p-doped compensation pillar 12 inlaid in the n-doped semiconductor layer 3. This compensation pillar 12 is so highly doped that, in the blocking mode, the charge carriers of the compensation pillar 12 and the charge carriers of the semiconductor layer 3 surrounding the latter cancel one another. Otherwise, in relation to details of compensation components, reference is made to U.S. Pat. No. 4,754,310, which was previously cited.

Of course, the compensation structure of compensation components is not restricted to pillar-type configurations, as shown in the exemplary embodiment of FIG. 18. Instead, other embodiments of compensation regions are also possible. In addition, the compensation regions do not need to be connected to the body zone 4. Instead, they can also be inlaid in a floating manner and, if appropriate, in regions separated from one another, in the semiconductor layer 3 forming a drift path.

Figure 19:
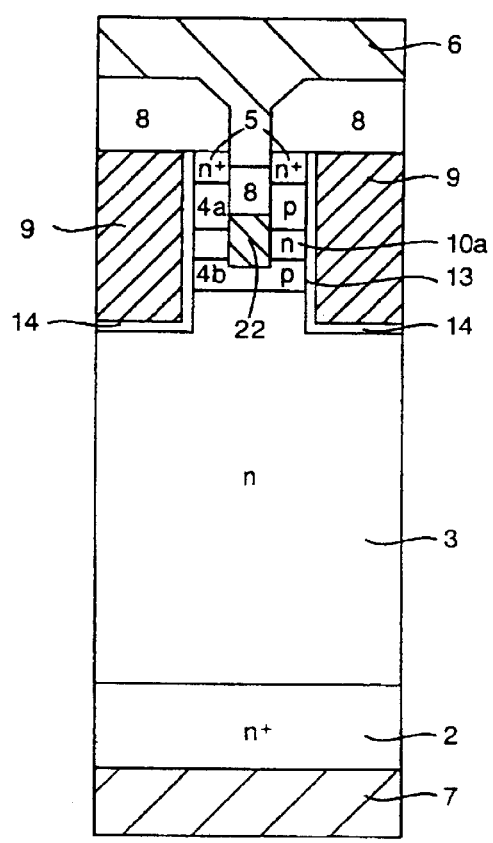
FIG. 19 is a sectional view showing a sixth embodiment of the second variant of a trench power transistor with reverse-blocking capability.

FIG. 19 shows, as a further exemplary embodiment of the power semiconductor component according to the invention of the second variant, a trench power transistor in which the gate electrode 9 is located in a trench 13 lined with an insulating layer 14 of silicon dioxide, for example. In this exemplary embodiment, too, the body zone 4 is subdivided by the n-doped region 10a into a source-side part 4a, which adjoins the source zone 5, and a drain-side part 4b, which is adjacent to the semiconductor layer 3 forming the drain.

Figure 20:
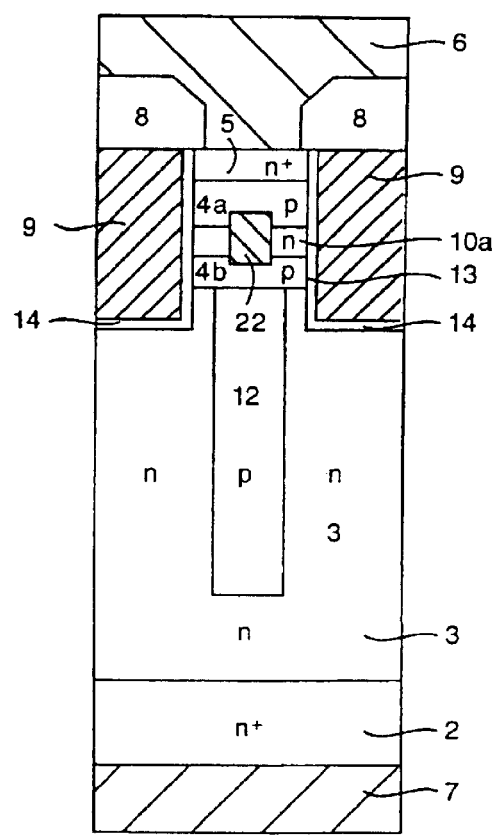
FIG. 20 is a sectional view showing a seventh embodiment of the second variant of a reverse-blocking trench power transistor with compensation structure.

FIG. 20 shows an exemplary embodiment that corresponds to the exemplary embodiment of FIG. 19, but here the power transistor has a compensation structure with a compensation pillar 12.

Figure 21:
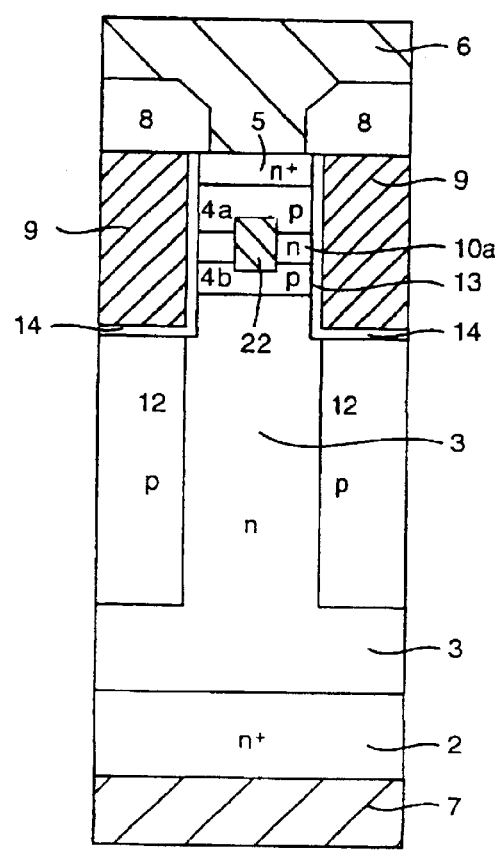
FIG. 21 is a sectional view showing an eighth embodiment of the second variant of a reverse-blocking trench power transistor with compensation structure.
Figure 22:
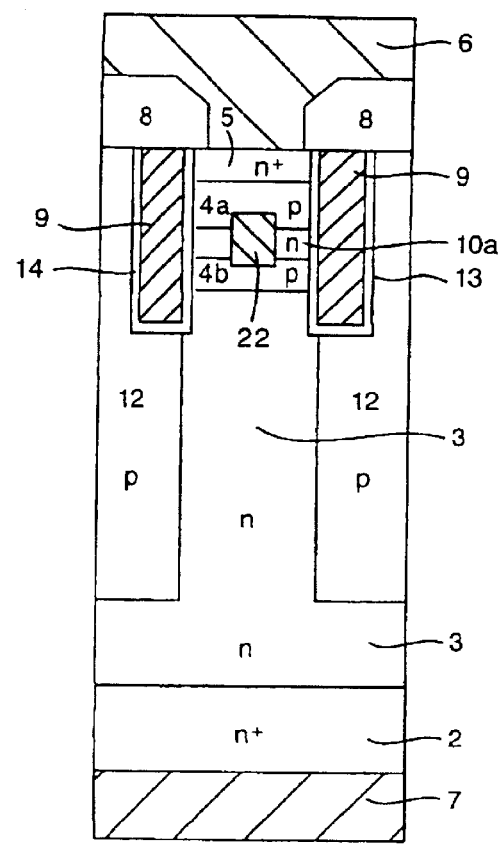
FIG. 22 is a sectional view showing a ninth embodiment of the second variant of a reverse-blocking trench power transistor with compensation structure.

In FIG. 21, this compensation structure is modified: two compensation pillars 12 here are located substantially underneath the areas of the trenches 13 and do not adjoin the body zone 4. Finally, FIG. 22 shows an exemplary embodiment in which the compensation pillars 12 are led past the trenches 13 at the sides and reach as far as the surface of the semiconductor body underneath the insulating layer 8.

The structures of power transistors explained above using FIGS. 14 to 22 can be implemented as configurations of strip cells, square cells, rectangular cells, hexagonal cells, or other cell shapes and can in each case be connected in parallel with one another.

FIGS. 23a, 23b and 24a, 24b illustrate a further two fundamentally further different exemplary embodiments of the power semiconductor component according to the invention.

Figure 23A:
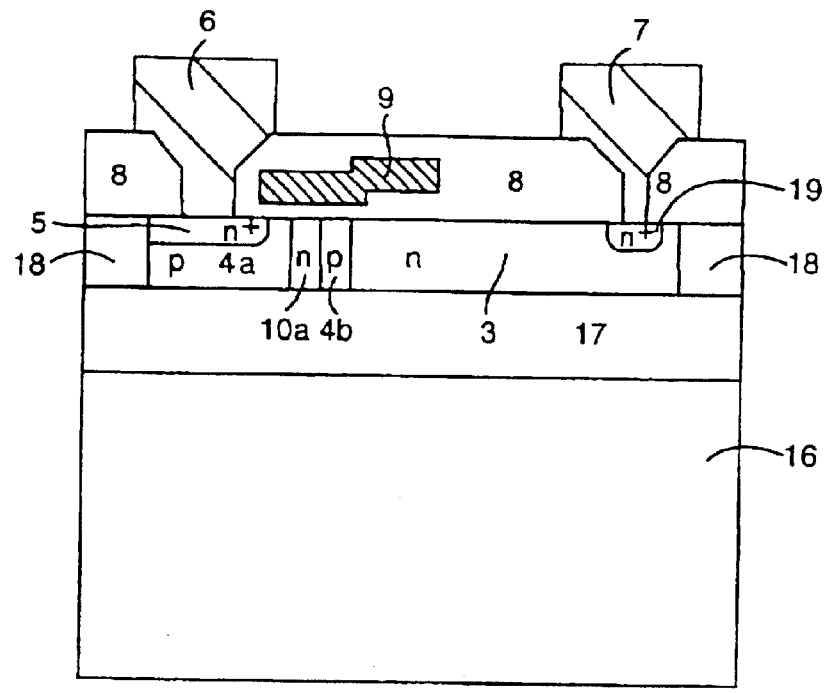
FIGS. 23a and 23b are sectional views showing a tenth embodiment of the second variant of a reverse-blocking power transistor in SOI technology (SOI=silicon-on-insulator) in two planes, lying one behind the other.
Figure 23B:
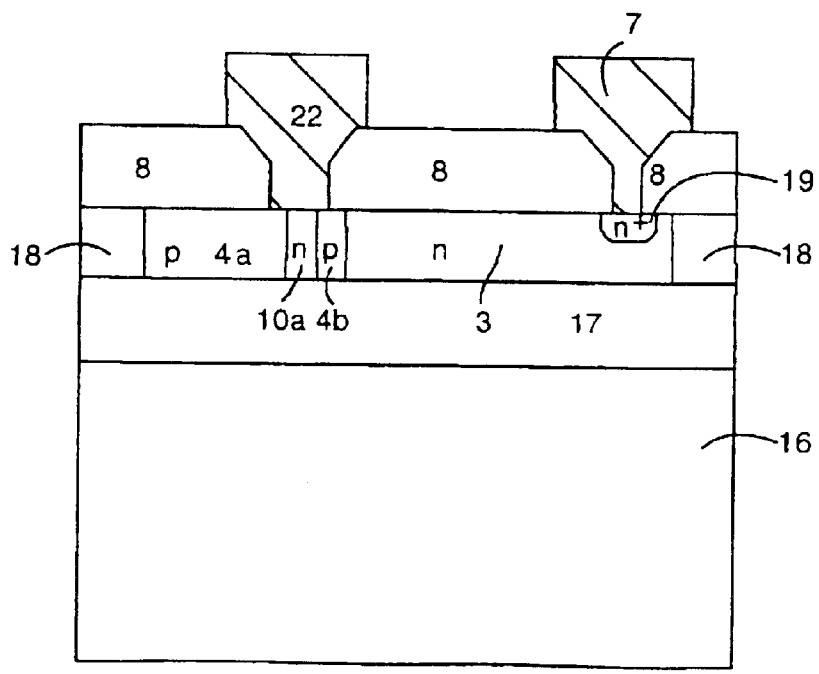

Thus, FIGS. 23a and 23b show a power transistor in SOI technology that is disposed above a silicon dioxide layer 17 on a carrier wafer 16 and is embedded in a further insulating layer 18. The body zone 4 here includes the source-side part 4a and the drain-side part 4b, which are separated from each other by the n-doped region 10a. An $n^+$-doped connecting region 19 is used, in a similar way to the silicon substrate 2, to provide good contact with the second metalization or drain electrode 7.

FIGS. 23a and 23b illustrate sections in various planes through the power transistor. The metalization 6 for the source is provided in a "front" area of the, for example, strip-like power semiconductor component, while the metal plug 22, which short-circuits the region 10a to the two parts 4a and 4b of the body zone 4, is placed in a "rear" area. Here, the second metalization 7 for drain is led over the entire depth of the power transistor.

Figure 24A:
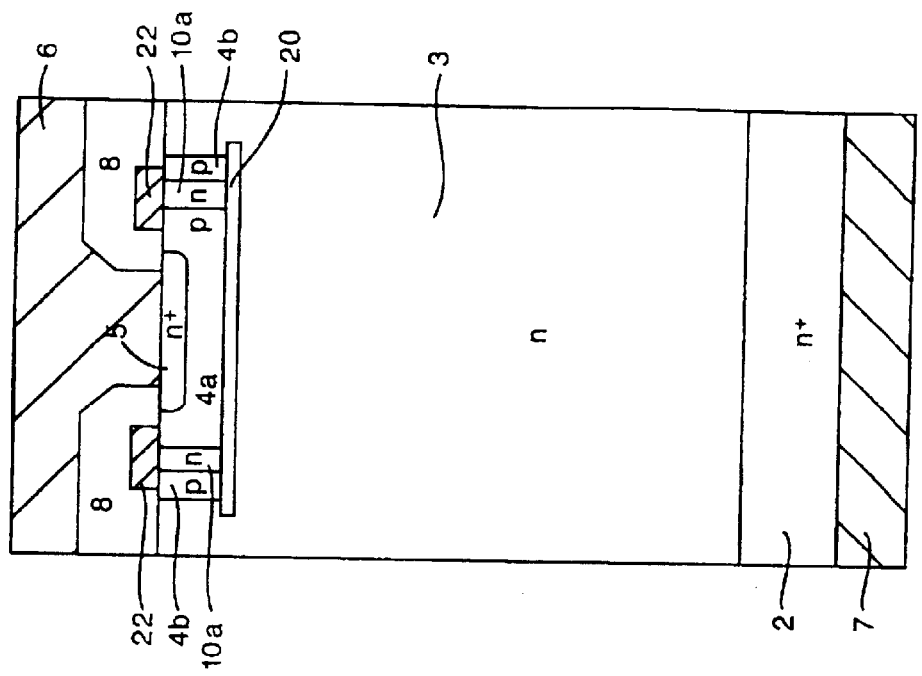
FIGS. 24a and 24b are sectional views showing an eleventh embodiment of the second variant of a reverse-blocking power transistor with a buried oxide layer in two planes, lying one behind the other.
Figure 24B:
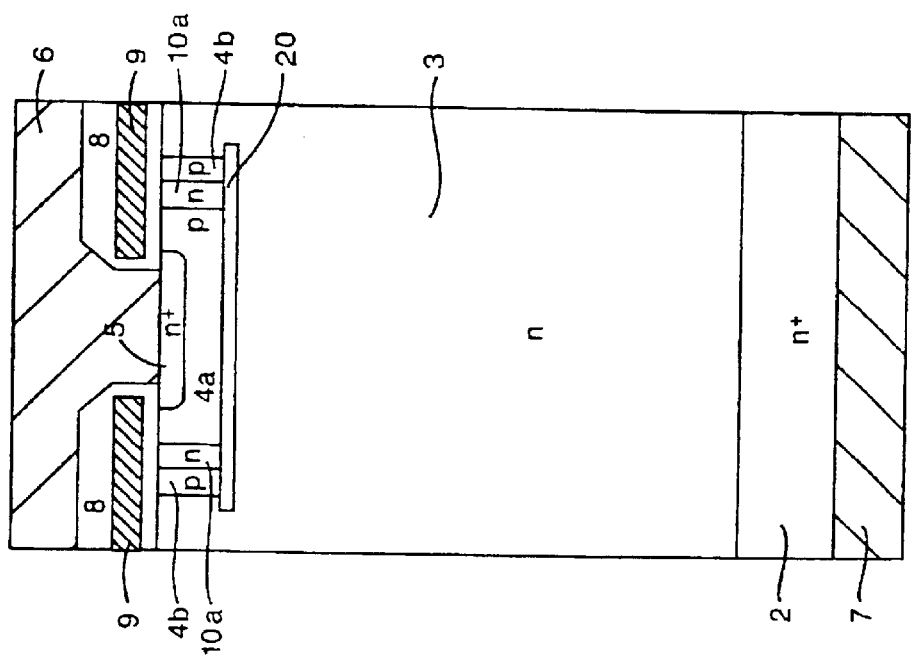

In a further reverse-blocking power transistor, shown in FIGS. 24a and 24b in two planes lying one behind the other, a buried insulating layer 20 of silicon dioxide, for example, is provided. The body zone 4 of this power transistor, as in the preceding exemplary embodiments, includes a source-side part 4a and a drain-side part 4b separated therefrom by the region 10a. In a similar way to the embodiment of FIGS. 23a and 23b, the gate electrode 9 is in a "front area" of the power transistor, while the metal plug 22 producing the short circuit between the region 10a, on the one hand, and the source-side part 4a and the drain-side part 4b of the source zone 4, is inlaid in the insulating layer 8 in a rear area.

The power semiconductor component according to the invention may also be built up in structural terms by a combination of two semiconductor chips. For this purpose, a first power MOSFET with a conventional construction (for example with compensation structure) 25, which ensures a forward blocking capability, and also a second power MOSFET 26, which merely has to exhibit a low blocking capability, are needed. This second MOSFET 26 achieves its reverse-blocking capability by being connected anti-serially in relation to the first MOSFET 25. In this case, the source contacts of the first and of the second MOSFET 25 and 26 are connected to each other. Likewise, the two gates of the MOSFETs 25, 26 are connected together to form a common connection. The drain of the second transistor 26 then forms the source of the overall structure, while the drain of the first transistor 25 constitutes the drain of the overall structure, as shown in the circuit diagram of FIG. 25.

In the turned-on state of this overall structure, the first MOSFET 25 is operated in the first quadrant of the current/voltage characteristic, that is to say "normally", while the second MOSFET 26 has current flowing through it in the reverse direction, that is to say is operated in the third quadrant.

Figure 25:
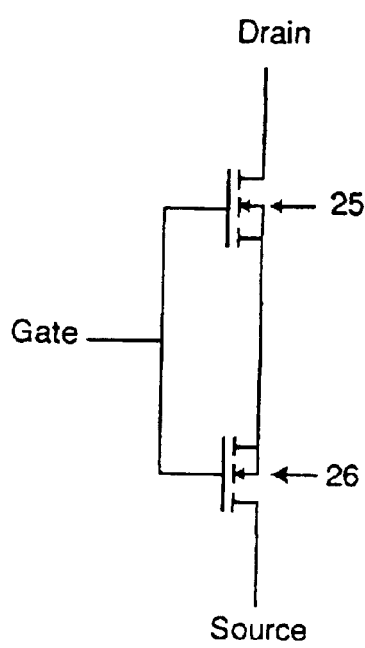
FIGS. 25 and 26 each are circuit diagrams showing a reverse-blocking power transistor combination having two oppositely switched transistors with a common gate connection.

The configuration of FIG. 25 is expediently accommodated in a common housing, which overall needs only three connections to the outside (source, gate, drain).

Mounting the chips in the housing side by side ("chip-bychip") or else on one another ("chip-on-chip") is possible.

Depending on the desired mounting, different structures may be preferred for the second MOSFET 26. A first example of this is a conventional vertical power MOSFET with a drain connection on the rear side and combined source/body connection on the front side. A second example is a lateral power MOSFET, in which the drain connection is also placed on the front side. Particularly advantageous for chip-on-chip mounting is a source-down transistor, as it is known, in which gate and drain are placed on the front side and source on the rear side.

Since the second transistor 26 needs only a low blocking capability, it is also possible to use a power transistor without a body connection: that is, with a floating body zone 4. Such a transistor can be used in the manner described above or else conversely, the drain of the second transistor 26 being connected to the source of the first transistor 25, and the source of the second transistor 26 serving as a source for the overall structure. A reverse-blocking power transistor combination of this type, in which the source of the transistor 25 is connected to drain or source of the transistor 26, whose body zone is not connected, can be seen from FIG. 26.

Figure 26:
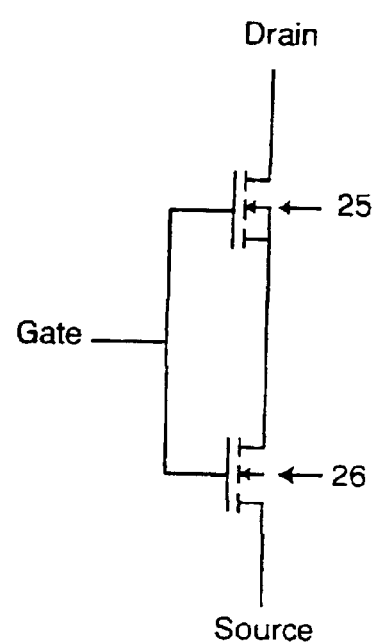
Figure 27:
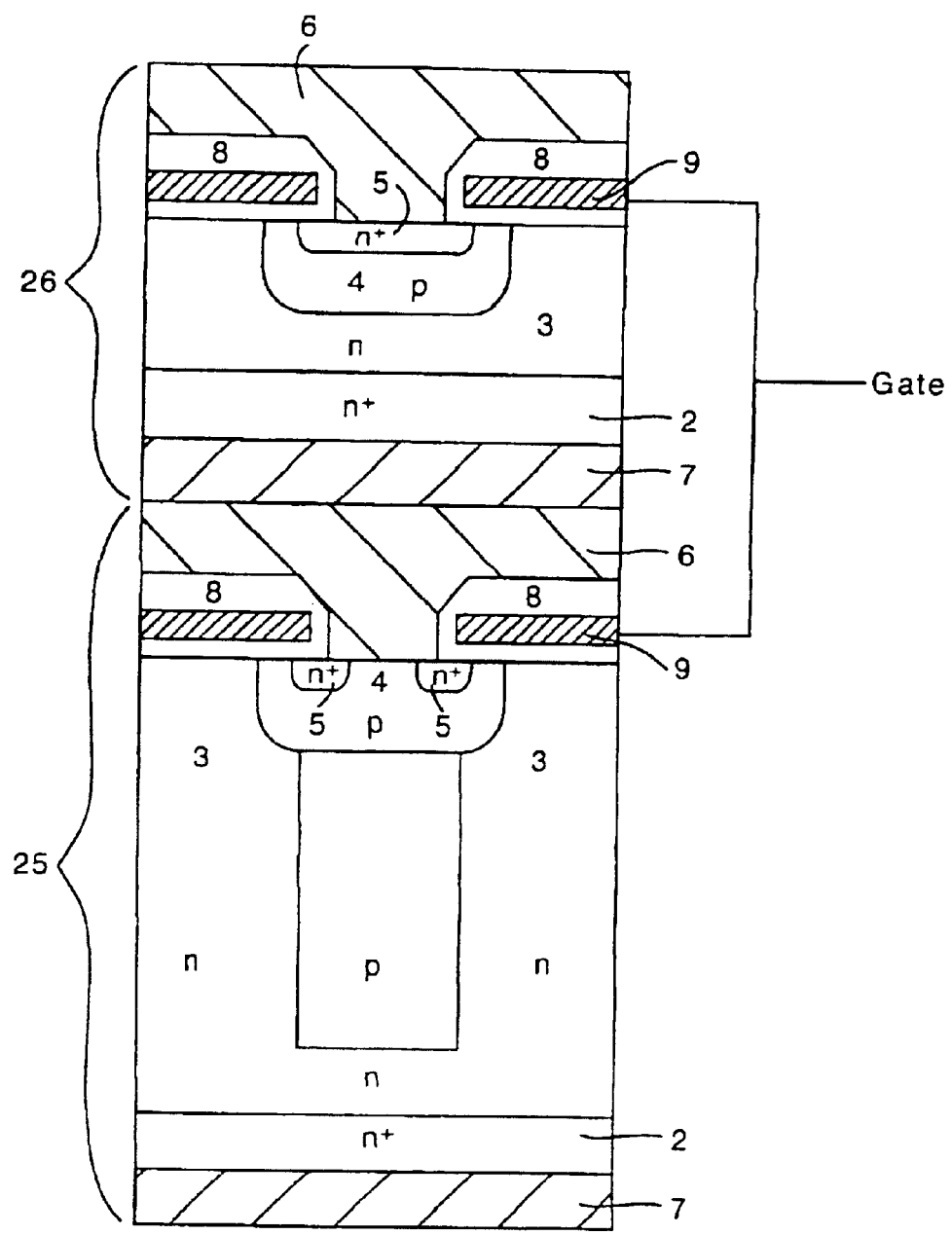
FIG. 27 is a sectional view showing a twelfth embodiment of the second variant of a reverse-blocking power transistor according to the circuit diagram of FIG. 26.

FIG. 27 shows a practical exemplary embodiment of the circuit according to FIG. 26. The gate electrodes 9 of the two transistors 25, 26 are connected together. The second metalization 7 (drain) of the transistor 26 is connected via the first metalization 6 of the transistor 25 to the body zone 4 and the source zone 5 of the transistor 25, whose second metalization 7 forms the drain of the overall structure. The source of the overall structure is provided by the first metalization 6 of the transistor 26.

In the structures of FIGS. 25 to 27, the body zones 4 of the two transistors 25, 26 in each case correspond to the parts 4b and 4a of th e body zone 4 of the preceding exemplary embodiments.

In the following text, a method of producing the power transistor according to the exemplary embodiment of FIG. 15 will also be explained, u sing FIGS. 28a to 28f.

Figure 28A:
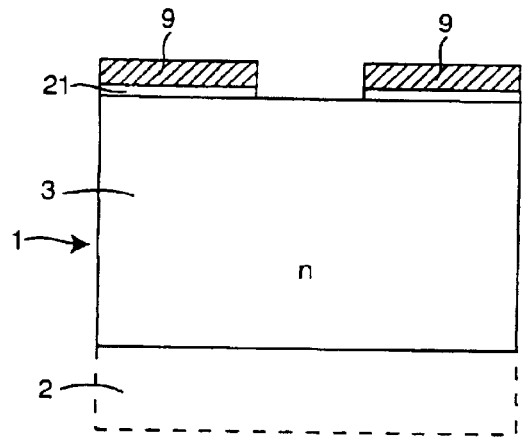
FIGS. 28a to 28f are sectional views showing a twelfth exemplary embodiment (cf.

Firstly, as shown in FIG. 28a, a semiconductor body 1 including an $n^+$-doped silicon substrate 2 and an n-doped semiconductor layer 3 deposited thereon epitaxially is provided. The semiconductor layer 3 is therefore weaklier doped than the silicon substrate 2. There follows a gate oxidization with formation of a gate insulating layer 21 of silicon dioxide and of gate electrodes 9 of doped polycrystalline silicon, both being structured in the usual way by etching, so that finally the structure shown in FIG. 28a is obtained.

Figure 28B:
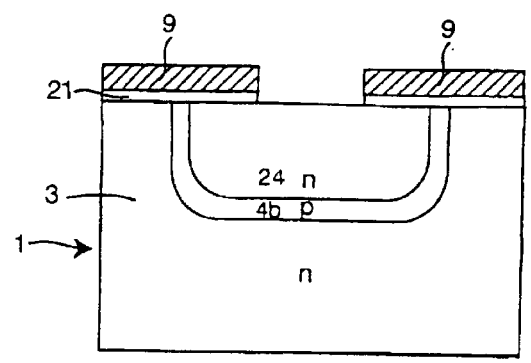

Then, as illustrated in FIG. 28b, the drain-side part 4b of the p-doped body zone 4 and an n-doped region 24 are introduced by implantation and outward diffusion. For the p-doping, boron, for example, can be used, while phosphorus is suitable for the n-doping. Depending on the desired doping levels, penetration depths and dopants used, the region of the part 4b and the region 24 can be produced in one order or another or else together. In any case, the structure shown in FIG. 28b is therefore obtained. It should be further remarked that, in FIG. 28b and in the following FIGS. 28c to 28f, the silicon substrate 2 has been left out in order to simplify the illustration.

Figure 28C:
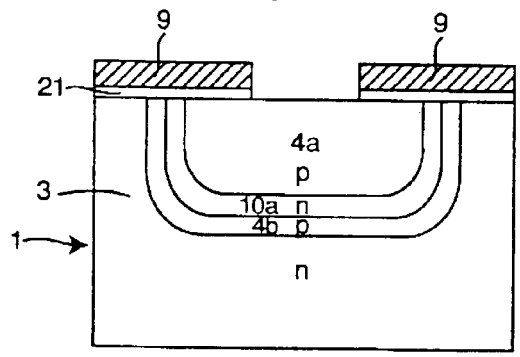

The source-side part 4a of the p-doped body zone 4 is then implanted and diffused, by which means the additional n-doped region 10a separating the parts 4a and 4b of the body zone 4 is also produced from the region 24. The structure obtained in this way is shown in FIG. 28c.

Figure 28D:
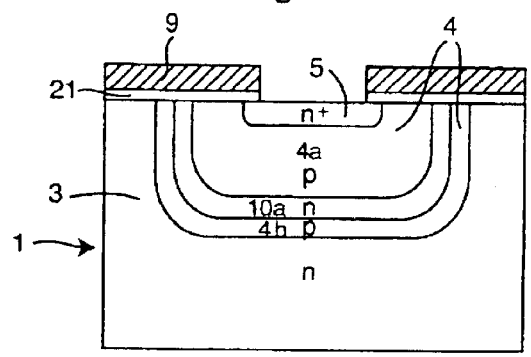

Next, the source zone S is introduced by implanting arsenic, for example, and by subsequent healing. In this way, the $n^+$-doped source zone 5 is produced. The structure shown in FIG. 28d is therefore present.

Figure 28E:
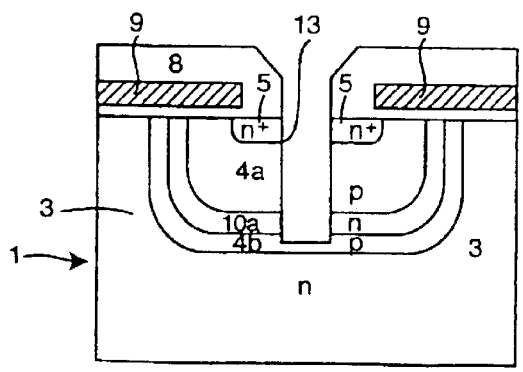

Then, a deposition of intermediate oxide and the etching of contact holes and trenches through the additional n-doped region 10a as far as the lower part of the body zone 4 are then performed. This produces the trench 13, which reaches as far as the part 4b of the body zone 4. In this way, the structure shown in FIG. 28e is present.

Finally, in the trench 13, the metal plug 22 is produced and etched back as far as the upper part of the body zone 4.

Figure 28F:
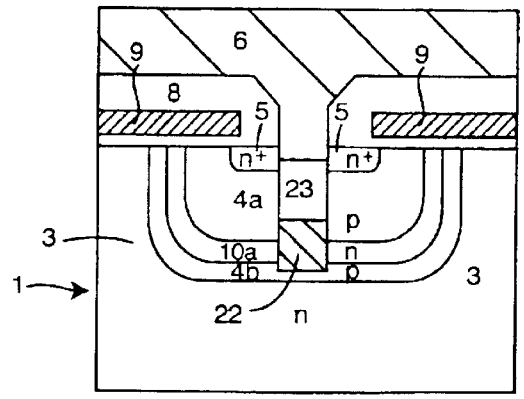

The insulating layer 23 is then formed, likewise with back-etching. As the last step, the first metalization 6 is applied. In this way, the structure shown in FIG. 28f is obtained.

In principle, the power semiconductor components of the other exemplary embodiments can be produced in a similar way. For example, in the exemplary embodiment of FIG. 19, the various doping regions 3, 4b, 10, 4a, and 5 can be produced in a corresponding way or else via a plurality of epitaxial steps. Furthermore, it is possible to produce the two p-doped parts 4a and 4b of the body zone 4 initially as a coherent region by epitaxy or implantation and diffusion and subsequently to insert the additional n-doped region 10a by implantation at high energy.

If a slowly diffusing dopant, such as arsenic or antimony, is used for the additional n-doped region, then the implantation can even be conducted before the diffusion of the body zone 4.

Finally, it is also further possible to produce the drain-side part 4b of the body zone by high-energy implantation.

In the case of the trench structures, that is to say for example in the exemplary embodiment of FIG. 19, the production of the metal plug 22 can be performed in a similar way to that in the case of the planar structures, that is to say in the exemplary embodiment of FIG. 15. In the exemplary embodiments which have the metal plug 22 providing the metal short circuit at the semiconductor surface, the metal plug can be formed in a conventional way, for example by vapor deposition.

I claim:

1. A reverse-blocking power semiconductor component, comprising:

a semiconductor body forming a drift path of one conduction type;

a body zone of the other conduction type, opposite to the one conduction type, provided in said semiconductor body;

a source metallization;

a source zone of the one conduction type placed in said body zone and connected to said source metallization; and a region of the one conduction type being inlaid in said body zone to define a source-side part and a drain-side part in said body zone, said region inlaid in said body zone being short-circuited at least to said drain-side part of said body zone;

said source metallization being connected electrically only to said source zone.

2. The power semiconductor component according to claim 1, wherein said region inlaid in said body zone is also short-circuited to said source-side part of said body zone.

3. The power semiconductor component according to claim 1, wherein said inlaid region is short-circuited with a purely resistive connection.

4. The power semiconductor component according to claim 1, wherein said inlaid region is short-circuited with a non-rectifying connection.

5. The power semiconductor component according to claim 1, wherein said inlaid region is short-circuited with a metal contact.

6. The power semiconductor component according to claim 5, wherein said metal contact is disposed in said semiconductor body.

7. The power semiconductor component according to claim 5, wherein said metal contact is disposed on a surface of said semiconductor body.

8. The power semiconductor component according to claim 1, wherein said inlaid region acts as an electron collector.

9. The power semiconductor component according to claim 1, wherein said semiconductor body forming the drift path has a doping between $2 \cdot 10^{16}$ charge carriers/cm$^3$ and $1 \cdot 10^{14}$ charge carriers/cm$^3$.

10. The power semiconductor component according to claim 1, wherein said semiconductor body forming the drift path has a thickness between 2 μm to 100 μm.

11. The power semiconductor component according to claim 1, including a compensation structure.

12. The power semiconductor component according to claim 11, wherein said compensation structure includes a compensation region inlaid in said drift path.

13. The power semiconductor component according to claim 12, including a floating compensation pillar.

14. The power semiconductor component according to claim 12, including a compensation pillar connected to said body zone.

15. The power semiconductor component according to claim 11, wherein said compensation structure includes a pillar-like compensation region.

16. The power semiconductor component according to claim 1, wherein said semiconductor body has a trench formed therein; and a gate is disposed in said trench.

17. The power semiconductor component according to claim 1, including a carrier wafer;

an oxide layer deposited on said carrier wafer; and said semiconductor body, said body zone, said source metallization, said source zone, and said region are formed on said oxide layer.

18. The power semiconductor component according to claim 1, including an insulating layer buried in said semiconductor body.

* * * * *